United States Patent
Yang et al.

(10) Patent No.: US 12,512,397 B2
(45) Date of Patent: Dec. 30, 2025

(54) SUBSTRATES HAVING ADHESION PROMOTOR LAYERS AND RELATED METHODS

(71) Applicant: The Intel Corporation, Santa Clara, CA (US)

(72) Inventors: Yi Yang, Gilbert, AZ (US); Suddhasattwa Nad, Chandler, AZ (US); Xiaoying Guo, Chandler, AZ (US); Jieying Kong, Chandler, AZ (US); Ala Omer, Phoenix, AZ (US); Christy Sennavongsa, Gilbert, AZ (US); Wei Wei, Chandler, AZ (US); Ao Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 641 days.

(21) Appl. No.: 17/855,662

(22) Filed: Jun. 30, 2022

(65) Prior Publication Data
US 2024/0006285 A1    Jan. 4, 2024

(51) Int. Cl.
*H05K 3/38* (2006.01)
*H01L 21/48* (2006.01)
(Continued)

(52) U.S. Cl.
CPC .... *H01L 23/49822* (2013.01); *H01L 21/4857* (2013.01); *H01L 23/145* (2013.01);
(Continued)

(58) Field of Classification Search
CPC ....... H05K 3/388; H05K 3/4038; H05K 1/115
See application file for complete search history.

(56) References Cited

U.S. PATENT DOCUMENTS

2003/0194872 A1    10/2003   Parikh et al.
2006/0163559 A1     7/2006   Koganei et al.
(Continued)

FOREIGN PATENT DOCUMENTS

RU          2262774 C2    10/2005

OTHER PUBLICATIONS

Liu et al., "Surface etching, chemical modification and characterization of silicon nitride and silicon oxide—selective functionalization of Si3N4 and SiO2," Journal of Physics: Condensed Matter, No. 28, 2016, 21 pages.
(Continued)

*Primary Examiner* — Sherman Ng
(74) *Attorney, Agent, or Firm* — Hanley, Flight & Zimmerman, LLC

(57) ABSTRACT

Substrate assemblies having adhesion promotor layers and related methods are disclosed. An example apparatus includes a substrate, a dielectric layer, a first copper layer between the substrate and the dielectric layer, and a film between the dielectric layer and the first copper layer. The film including silicon and nitrogen and being substantially free of hydrogen. A via in the dielectric layer is to provide access to the first copper layer. A portion of the first copper layer uncovered in the via, a wall of the via and the portion of the first copper layer to be substantially free of fluorine. A seed copper layer positioned on the dielectric layer. The via wall and the portion of the first copper layer. The seed copper layer and the first copper layer define an undercut at an interface between the seed copper layer and the first copper layer.

20 Claims, 9 Drawing Sheets

(51) Int. Cl.
*H01L 23/14* (2006.01)
*H01L 23/498* (2006.01)
*H05K 1/11* (2006.01)
*H05K 3/22* (2006.01)
*H05K 3/40* (2006.01)
*H01L 23/00* (2006.01)
*H05K 1/03* (2006.01)

(52) U.S. Cl.
CPC ........ *H01L 23/49866* (2013.01); *H05K 1/115* (2013.01); *H05K 3/22* (2013.01); *H05K 3/4038* (2013.01); *H01L 24/16* (2013.01); *H01L 2224/16227* (2013.01); *H05K 1/032* (2013.01); *H05K 2203/0766* (2013.01); *H05K 2203/0779* (2013.01); *H05K 2203/107* (2013.01)

(56) References Cited

U.S. PATENT DOCUMENTS

| | | |
|---|---|---|
| 2006/0197441 A1 | 9/2006 | Tsai et al. |
| 2009/0047759 A1 | 2/2009 | Yamazaki et al. |
| 2020/0365533 A1* | 11/2020 | Manepalli ......... H01L 23/53233 |
| 2023/0369507 A1 | 11/2023 | Muir |
| 2024/0006300 A1 | 1/2024 | Yang et al. |

OTHER PUBLICATIONS

United States Patent and Trademark Office, "Non-Final Office Action," issued in connection with U.S. Appl. No. 17/855,667, dated Aug. 20, 2025, 25 pages.

* cited by examiner

SUBSTRATES HAVING ADHESION PROMOTOR LAYERS AND RELATED METHODS

FIELD OF THE DISCLOSURE

This disclosure relates generally to integrated circuit packaging and, more particularly, to substrates having adhesion promotor layers and related methods.

BACKGROUND

Integrated circuit (IC) chips and/or semiconductor dies are routinely connected to larger circuit boards such as motherboards and other types of printed circuit boards (PCBs) via one or more package substrates (e.g., interconnects). As integrated circuit (IC) chips and/or dies reduce in size and interconnect densities increase, alternatives to traditional substrate layers are needed for providing stable transmission of high frequency data signals between different circuitry and/or increased power delivery.

Figure 1:
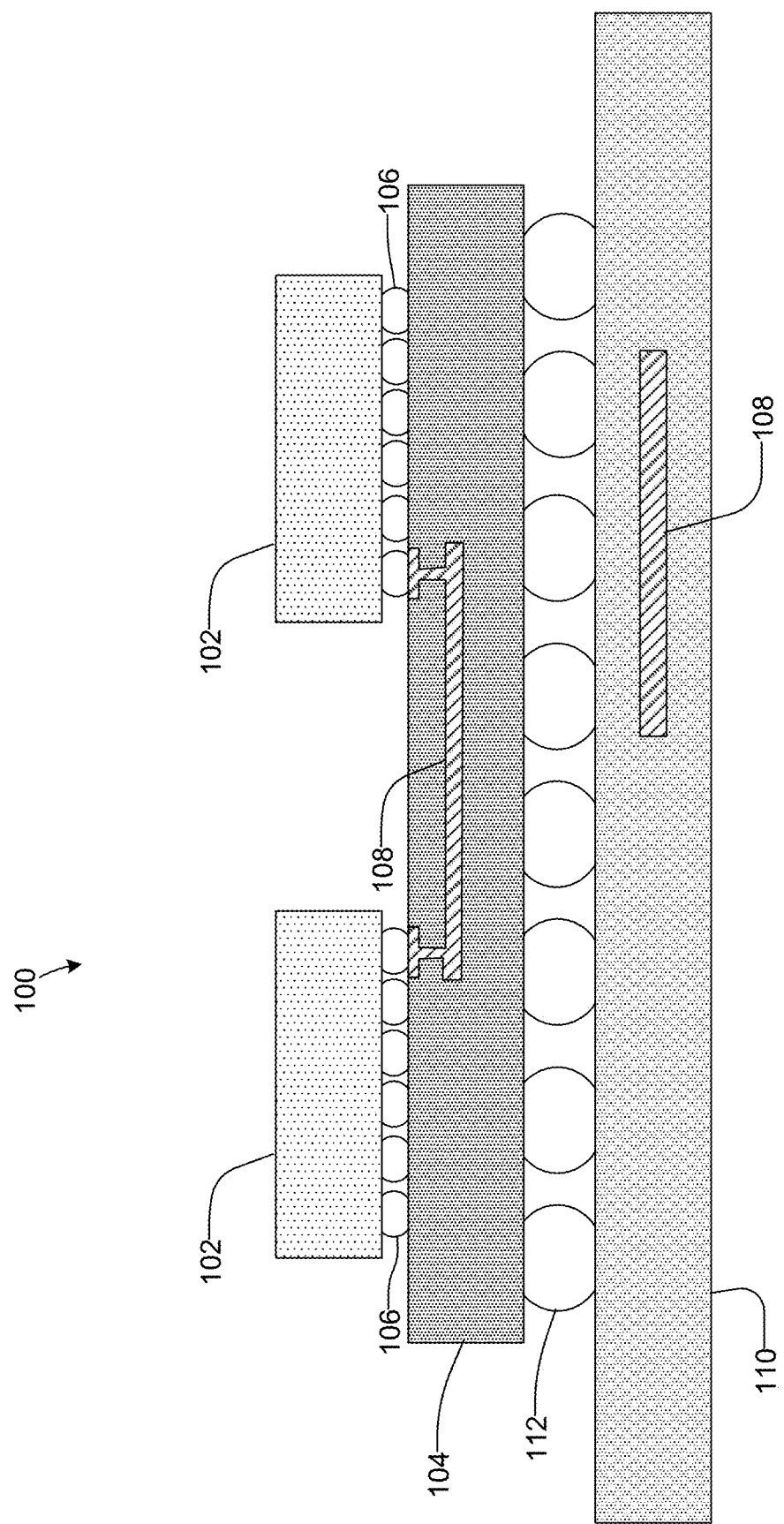
FIG. 1 is a cross-sectional view of an example semiconductor package constructed in accordance with teachings of this disclosure.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are provided. Specifically, as used herein, a first component of an integrated circuit is "above" a second component when the first component is farther away from the bulk region of the semiconductor substrate than the second component. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc.

DETAILED DESCRIPTION

As package substrates become thinner to achieve a lower profile, a core of the substrate requires higher performance interconnects that improve data rate to improve bandwidth. Substrates for next generation chip-to-chip interconnect technologies require significantly higher speed and higher density input/output (I/O) routing. For example, multi-core processors are often employed to provide high speed/high performance devices. These processors need increased processor-to-processor (or I/O hub) and processor-to-memory bandwidth to make optimal use of the increased computing power of the multi-core processors. Additionally, to transmit multiple and/or high frequency signals between package components, semiconductor packages often employ planar transmission lines such as microstrip, stripline, and coplanar transmission lines to transmit signals and/or power. Furthermore, in high density, high speed interconnect substrates, increased power delivery and signaling requirements require dense signaling process areas of a build-up layer or a bump layer of a semiconductor package.

Demand for improving performance is driving package transmission lines to operate at high frequencies (e.g., greater than 1 Gigahertz) while maintaining package insertion loss budget. Conductive traces, leads, interconnects, and/or other electrically conductive material of a substrate are typically composed of copper. To promote adhesion between organic dielectric material(s) and an underlying copper trace, transmission line, or pad, an underlying surface of the copper is roughened to provide an anchor that enables a laminated dielectric to mechanically adhere with the copper layer or material. However, the surface roughness on copper surfaces can produce significant signal losses with data transfers at high frequencies (e.g., data transfer rates greater than 500 gigahertz (GHz)). For example, signal loss is proportional (e.g., non-linearly) to data rate frequency. Thus, as data rate frequency increases, the signal loss across the roughened copper surface also increases proportionately to the data rate frequency. As a result, an increased surface roughness causes increased signal loss. However, such surface roughness is needed to provide high reliability and/or adhesion characteristics (e.g., to reduce delamination risk) between a copper or other metal layer and a dielectric layer. Thus, advanced electronic packaging architectures having high signaling speeds (e.g., data transfer rates greater than 500 gigahertz (GHz)) require a reduction and/or elimination of the surface roughness of copper layers to improve insertion loss characteristics. However, reduced surface roughness leads to poor package reliability due to poor adhesion between the dielectric layers and the smooth conductive traces.

To reduce or remove the need for roughened copper or metal surfaces of a conductive layer, some package systems employ an adhesion layer between copper-dielectric interface(s) to facilitate and/or improve adhesion and/or reliability between the copper-dielectric interface(s). For example, some package systems employ organic adhesion promotors using a wet product of record (POR), semi-additive process (SAP) manufacturing process. The organic adhesion promotors rely on spray/dipping based film deposition, where film growth is driven by a copper-ligand complexation at a copper surface, inducing a three-dimensional intermolecular polymerization to provide a bulk film matrix. For example, such example organic adhesion promotors begin with a tri-functional group ended monomer in a deposition solution. This framework of gathering functionalities into one molecule structure limits the flexibility on a molecular design and synthesis, in which case some of the more favorable functional groups with the desired adhesion performance may not be practically utilized. Furthermore, this method relies on inter-molecular polymerization and complexation to provide the bulk film matrix, which results in highly disordered three-dimensional stack-ups and, thus, potential film defects and/or low bonding density. These disadvantages compromise an overall effectiveness of adhesion between a copper and dielectric interface. In some instances, the reduced bonding strength and/or vulnerability from downstream wet chemical attack (e.g., from chemical vapor deposition processes) of this organic adhesive layer often results in interface failure and/or reliability issues (e.g., delamination) of packaging systems or products.

Some example packaging systems employ an inorganic adhesion promotor film in a semi-dry, semi-additive process (SAP) manufacturing process. For example, an inorganic adhesion promotor film such as, for example, a silicon nitride (SiNx) film is deposited on a copper layer by chemical vapor deposition (CVD) or plasma enhanced chemical vapor deposition (PECVD). The inorganic adhesion promotor film provides a diffusion barrier that bonds with the copper layer to prevent oxidation of a copper layer and, thus, prevent or reduce risk of delamination at a dielectric/copper layer interface. However, the CVD or PECVD processes require use of high processing temperatures (e.g., temperatures as high as 370 degrees Celsius (370° C.)), which are greater than a threshold temperature (e.g., less than 250° C.) of organic substrates and/or materials to ensure package/device integrity. Thus, substrates having organic materials may not be used.

Additionally, inorganic adhesion promotor films (e.g., silicon nitride thin film) applied by CVD or PECVD manufacturing processes cause the adhesion promotor films (e.g., a SiNx film) to have porous structures or characteristics. Such porous structures compromises the chemical resistance of adhesion promotor films from further downstream wet chemical processing (e.g., CVD or PECVD etching). Additionally, inorganic adhesion promotor films (e.g., a silicon nitride thin film) having porous structures can cause low density promotor layers due to incorporation of hydrogen residual remaining in a film matrix (i.e., as a result of the CVD or PECVD process). Furthermore, adhesion promotor films (e.g., a SiNx film) having a porous structure may not provide effective hermeticity to protect a copper layer (e.g., traces) from oxidation, which can cause interfacial delamination between a copper-dielectric interface.

Example apparatus and methods disclosed herein provide packaging assemblies (e.g., semiconductor packages) having relatively smooth (e.g., non-roughened) conductive layers (e.g., metal layers, copper layers, etc.) to improve insertion loss characteristics while maintaining package reliability and/or integrity. In other words, example apparatus and methods disclosed herein provide non-roughened conductive surfaces (e.g., copper traces) for high speed packaging systems without compromising adhesion characteristics, thereby reducing or eliminating the risk of delamination between metal-dielectric (e.g., copper/dielectric) interfaces and improving reliability between metal-dielectric interfaces. Thus, example apparatus and methods disclosed herein employ smooth conductive layer(s) (e.g., a metal or copper layer). Specifically, because the conductive layer has a smooth, non-roughened surface finish and is not roughened as in the traditional manufacturing processes, example packaging systems disclosed herein reduce power loss and/or insertion loss characteristics.

Examples disclosed herein include a non-roughening adhesion promotor film (e.g., a SiNx film) deposited on a smooth conductive layer (e.g., copper layer). Additionally, example adhesion promotor films disclosed herein have negligible impact on power loss and/or signal propagation when adhered to conductive layers (e.g., metal layers, copper layers, etc.). Unlike conventional methods of employing CVD or PECVD processes to apply adhesion promotor layers, example apparatus and methods disclosed herein employ sputtering manufacturing techniques to apply adhesion promotor films (e.g., a sputtered adhesion promotor layer, a silicon nitride (SiNx) thin films) on smooth, non-roughed conductive layers to enable low insertion loss requirement for next generation of packaging technology. The adhesion promotor layer is provided between copper layers and dielectric layers. In some examples disclosed herein, a conductive layer (e.g., trace pattern, pads, power traces, etc.) can be provided on an organic substrate having a smooth, non-roughened surface finish.

Subsequently, an inorganic adhesion promotor film (e.g., a non-roughened adhesion promotor film) disclosed herein can be applied to the smooth, non-roughened surface finish of the conductive layer via a plasma vapor deposition (PVD) manufacturing process. Compared to chemical vapor deposition (e.g., PECVD) adhesion promotor films (e.g., PECVD SiNx films), which requires high process temperature and precursor gases, sputtered adhesion promotor films (e.g., SiNx films) disclosed herein can be processed at low temperatures to enable device integrity free of impurities and/or voids and provide dense and/or hermetic characteristics with higher manufacturing throughputs. Additionally, PVD manufacturing techniques enable use of substrates including organic materials because the PVD requires use of relatively lower temperatures during manufacturing (e.g., temperatures less than 250° C.).

For example, employing sputtering (e.g., PVD) manufacturing techniques to apply adhesion promotor films provide higher density films compared with adhesion promotor films deposited by chemical vapor deposition (e.g., PECVD). A higher density film improves and/or promotes hermeticity to prevent copper oxide that can cause delamination between a copper-dielectric interface. The sputtered adhesion promotor films disclosed herein provide improved adhesion characteristics (e.g., between conductive layers (e.g., the copper layers) and a build-up dielectric that is subsequently laminated to the conductive layer). The build-up dielectric layer can then be laminated on the adhesion promotor film that coats or covers the conductive layer (e.g., traces and/or pads).

One or more vias can then be provided in the dielectric material using, for example, carbon dioxide (e.g., $CO_2$) or ultra-violet (e.g., UV) laser drilling manufacturing techniques. Post laser drilling, adhesion promotor film remaining at a bottom of a via can be removed using, for example, a dry desmear process to (e.g., completely) remove the adhesion promotor film. To accommodate etching or removal of the adhesion promotor film (e.g., SiNx film) at a via bottom, a dry etching manufacturing technique (e.g., dry desmear or plasma-based etching) is used to remove the adhesion promotor film (e.g., SiNx residuals) or residue(s) at the via bottom. Dry desmear process is employed to remove the adhesion promotor layer from the via because such material is difficult to remove (e.g., hardly removed) by traditional wet desmear treatment or processes. Additionally, the dry desmear manufacturing process removes dielectric material residue from the via.

Dry etch processes, such as dry desmear, can leave behind residues on a substrate. Although these residues may serve a beneficial role during a dry etch process, these residues are undesirable after the completion of the dry etch process. In a bark end of a line processes, where both dielectrics, such as silicon dioxide ($SiO_2$), and metals, such as aluminum (Al), are present, the residues left behind by dry etch processes may be undesirable post-etch residues that are often difficult to remove without damaging desired substrate features. Further, dielectric materials and/or the plasma species applied during plasma vapor deposition when applying the adhesion promotor layer can contain fluorine (F). Thus, fluorine can be present at a bottom of a via after via formation and/or on surfaces of the dielectric material. Fluorine material on a conductive layer or interconnect layer can compromise or affect adhesion of a seed layer when employing electro or electro-less seed deposition processes, which can lead to interfacial delamination/reliability issues. In some instances, fluorine residual can also potentially cause short circuit of a die.

Example apparatus and methods disclosed herein employ a rinsing process to remove fluorine material and/or other residues effectively and efficiently from a substrate or a via following a dry etching process. In some examples, dry desmear is followed by a rinsing process. Example rinsing processes disclosed herein remove loosely-bonded particles and/or fluorine residue(s). Cleaning the loosely-bonded particles and/or fluorine residue from the via enables good adhesion between underlayer metal layers (e.g., copper traces) and a seed layer (e.g., an electro-less seed layer) to improve and/or provide reliable interconnect interfaces (i.e., substrates that are not susceptible to delamination and/or short circuit).

Example apparatus and methods disclosed herein employ an aqueous solution (e.g., at least one of a hot water rinse or an acid rinse) to remove fluorine residual material (and/or other residues) from a via after a dry etching process. For example, the rinse solution disclosed herein (e.g., a hot water rinse and/or acid rinse) can be applied (e.g., at a via bottom) to protonate fluorine (F) to create volatile hydrogen fluoride (HF) for the fluorine removal. In some examples, a hot water rinse is employed (e.g., without an acid). In some examples, a combination of a hot water rinse and an acid is employed, where a hot water rinse is provided before or after application of the acid rinse. In some examples, a hot water and acid mixture is employed. As used herein, hot water includes water (e.g., deionized water) having a temperature that exceeds approximately 70 degrees Celsius.

Additionally, example apparatus and methods disclosed herein provide a conditioner treatment. The conditioner treatment can include an acid material including, for example, sulfuric acid. The conditioner treatment disclosed herein provides an acidic environment for (e.g., complete) removal of copper hydroxide Cu(OH)2 precipitates as the by-product of a hot water rinse. Removal or reduction of fluorine, copper hydroxide precipitates and/or other residues (e.g., at via bottom or from the via) enables effective electro or electro-less adhesion to promote via integrity and/or product reliability.

After cleaning is performed, a seed layer is applied using wet electro or electro-less seed deposition manufacturing processes. After the seed layer is provided, any additional layer(s) (e.g., metal layers, dielectric layers, build-up layers, vias, etc.) can be added (e.g., using the techniques disclosed herein or other traditional manufacturing processes). Thus, example methods, apparatus and articles of manufacture disclosed herein improve package substrate reliability and/or reduce package substrate manufacturing costs.

Example packaging systems (e.g., semiconductor packages) disclosed herein can be used with semiconductor dies or chiplets (e.g., tiles) that can implement controllers, microprocessors, Digital Signal Processors (DSPs), Central Processor Units (CPUs), Graphics Processor Units (GPUs), programmed microprocessors, Field Programmable Gate Arrays (FPGAs), Application Specific Integrated Circuits (ASICs), Reduced Instruction Set Computers (RISCs), any other circuitry and/or combinations thereof. Additionally, example semiconductor packages disclosed herein can be used with chiplets of a disaggregated die. Each chiplet (also referred to as a tile) may implement a dedicated function. Together, the chiplets may implement a complex circuitry. The complex circuitry can be any type of device that can be implemented as a plurality of chiplets that are physically separated from, but communicatively coupled to, one another. For example, processor circuitry may be implemented by two or more separate chiplets that together implement a microprocessor, etc. Alternatively, in other examples, example semiconductor packages disclosed herein may be different chips (e.g., a processor circuitry, a memory, and/or or some other type of component) that together implement a system on a chip (SoC) in a semiconductor package.

FIG. 1 is a cross-sectional view of a package system 100 (e.g., a semiconductor package) constructed in accordance with teachings of this disclosures. The package system 100 of the illustrated example includes a plurality of dies 102 (e.g., integrated circuits) electrically coupled to a package substrate 104 with interconnects 106. For example, the interconnects 106 can include C4 bumps, wire bonds, solder balls, pins, etc. and/or any other suitable interconnect architecture. The package substrate 104 of the illustrated example includes a plurality of conductive features 108 (e.g., pads, traces, vias, and the like) to electrically and/or communicatively couple the dies 102, the package substrate 104, and/or a board 110 (e.g., a printed circuit board (PCB)). The package substrate 104 of the illustrated example is electrically coupled to a board 110 with interconnects 112. For example, the interconnects 112 can include solder bumps, pins, and/or any other interconnect architecture. The board 110 of the illustrated example includes a plurality of conductive features 108 (e.g., conductive pads, vias, routing traces, power/ground planes, vias, etc.) that electrically connect the dies 102 (e.g., integrated circuits) with other electronic components coupled to the board 110. The substrate may have multiple layers of routing traces and vias to interconnect the dies 102 and the board 110. The package substrate 104 and/or the board 110 of the illustrated example are suitable for high speed signaling applications while maintaining high reliability.

Figure 2:
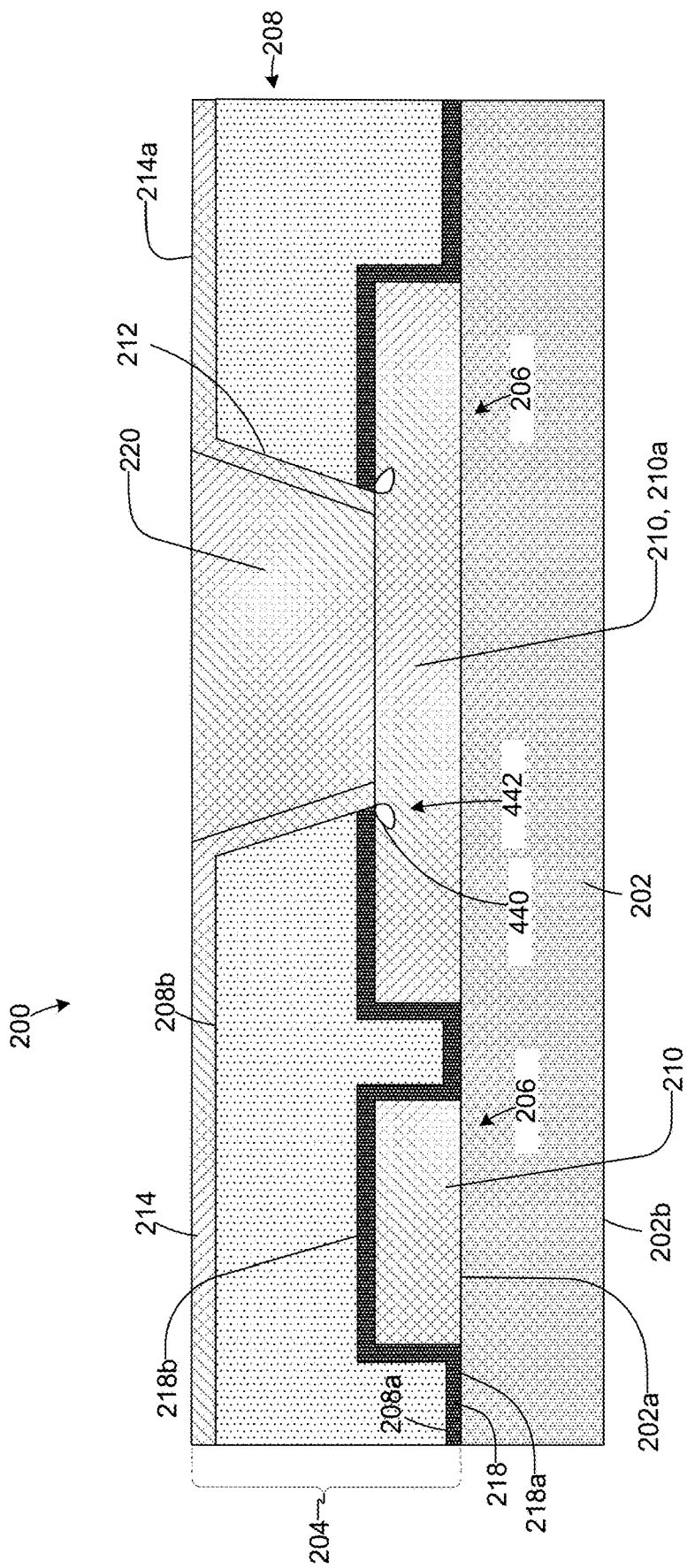
FIG. 2 is a cross-sectional view of an example substrate assembly that can be used to implement the example semiconductor package of FIG. 1.

FIG. 2 is a cross-sectional view of an example substrate assembly 200 disclosed herein (e.g., a semiconductor package). The example substrate assembly 200 of the illustrated example can implement the package substrate 104 and/or the board 110 of FIG. 1. For example, the substrate assembly 200 of the illustrated example can implement the conductive features 108 of the example package substrate 104 and/or the board 110 of FIG. 1. As described in greater detail below, one or more of the conductive features 108 of FIG. 1 includes relative smooth, non-roughened surfaces (e.g., a non-roughened copper surface having a roughness of less than 1 micrometer (μm)).

The example substrate assembly 200 of FIG. 2 includes an example substrate 202 (e.g., a core substrate) and a build-up layer 204 provided with the substrate 202. The substrate 202 of the illustrated example is made of an organic material. In some examples, the substrate 202 is organic resin, epoxy-based resin and/or any other organic material(s). In some examples, the substrate 202 can include an inorganic material. In some examples, the substrate 202 can be a dielectric material(s) including, but not limited to, epoxy, polyimide, and/or any other suitable dielectric material(s).

The build-up layer 204 of the illustrated example includes a conductive layer 206 and an insulating or dielectric layer 208. Specifically, the dielectric layer 208 is provided on a first surface 202a (e.g., a first side or upper surface in the orientation of FIG. 2) of the substrate 202. The dielectric layer 208 can include, but is not limited to, epoxy, polyimide, and/or any other suitable dielectric material(s) (e.g., non-electrically conducting or semi-conducting material(s)). The conductive layer 206 of the illustrated example includes copper. However, in some examples, the conductive layer 206 can be aluminum, gold, platinum and/or any other suitable conductive material(s).

In some examples, the dielectric layer 208 and the conductive layer 206 (e.g., patterned electrically) provide a plurality of traces 210a, 210b, 210c between the dielectric layer 208 and the substrate 202. The traces 210a-210c of the illustrated example can define signal traces (e.g., signaling lines) to transfer signals or information between various components (e.g., transistors, capacitors, resistors, backend layers, etc. and/or other circuitry) of a semiconductor package (e.g., the package system 100 of FIG. 1) and/or power traces for transferring or carrying power to the various components of a semiconductor package (e.g., the package system 100 of FIG. 1).

The substrate assembly 200 of the illustrated example includes a via 212 (e.g., an electrically conductive via, a copper plated via, etc.) that extends through the dielectric layer 208 and electrically interconnects the first conductive layer 206 positioned adjacent a first side 208a (e.g., a first surface or lower surface in the orientation of FIG. 2) of the dielectric layer 208 and a second conductive layer 214 positioned adjacent a second side 208b (e.g., a second surface or upper surface in the orientation of FIG. 2) of the dielectric layer 208 opposite the first side 208a. In other words, the first conductive layer 206 is separated from the second conductive layer 214 by the dielectric layer 208 (e.g., by a thickness of the dielectric layer 208 in a vertical direction in the orientation of FIG. 2). As described in greater detail below, the second conductive layer 214 can be a conductive seed layer. The via 212 of the illustrated example is filled with a conductive filler layer 220 (e.g., a pad).

To promote or improve adhesion between the conductive layer 206 and the dielectric layer 208, the substrate 202 of the illustrated example includes an adhesion promotor layer 218 (e.g., a film). The adhesion promotor layer 218 of the illustrated example is positioned between the conductive layer 206 and the dielectric layer 208. For example, the adhesion promotor layer 218 has a first side 218a that couples to (e.g., directly engages or contacts) a first surface 206a (e.g., a first side or upper surface) of the conductive layer 206 and a second side 218b opposite the first side 218a that couples to (e.g., directly engages or contacts) the first side 208a of the dielectric layer 208. The adhesion promotor layer 218 of the illustrated example enhances adhesion between the dielectric layer 208 and the conductive layer 206. Specifically, the adhesion promotor layer 218 enables or enhances adhesion for lamination reliability between the dielectric layer 208 and the conductive layer 206 without having to roughen a surface (e.g., the first surface 206a) of the conductive layer 206.

Typically, a roughened surface includes microscopic crevices or ridges in a surface of a conductive layer. For example, typically, roughened copper surfaces are microscopic crevices or ridges on a surface of a conductive layer (e.g., copper traces) having depths of approximately between 5 micrometers (μm) and 8 micrometers (μm) to promote adhesion between a conductive layer and a dielectric layer 208.

The adhesion promotor layer 218 of the illustrated example eliminates the need to roughen the surface of the conductive layer 206. In other words, the substrate assembly 200 of the illustrated example does not undergo a manufacturing process (e.g., a mechanical roughing manufacturing step, a chemical or oxide roughening step, etc.) to roughen a surface of a conductive layer. For example, the first surface 206a of the conductive layer 206 can have a relatively smooth, non-roughened surface finish. For example, the first surface 206a of the conductive layer 206 having a relatively smooth, non-roughed surface can have a surface finish roughness of less than 1 micrometer (μm), between approximately 2 nanometers and 500 nanometers, or less than 5 micrometers (μm). The adhesion promotor layer 218 of the illustrated example is an inorganic material. For example, the adhesion promotor layer 218 is silicon nitride (SiNx) (e.g., a silicon nitride film). However, in other examples, the adhesion promotor layer 218 can include silicon and nitrogen, aluminum, oxygen, any suitable inorganic adhesion promotor material, any suitable organic adhesion promoter material, a combination thereof, and/or any other adhesion promotor material(s). In operation, the adhesion promotor layer 218 (e.g., a SiNx film) does not cause and/or affect power loss characteristics and/or does not impede signal propagation when coupled to the conductive layer 206.

Although the substrate assembly 200 of the illustrated example includes a single via 212 and a single dielectric layer 208, the substrate assembly 200 can include a plurality of dielectric layers 208 and/or a plurality of vias 212. Additionally, although not shown, a build-up layer can be formed on a second surface 202b of the substrate 202 opposite the first surface 202a. In some examples, a build-up layer can be formed on a first surface 210c of the second electrical contact 210b. In some examples, the substrate assembly 200 can include a plurality of build-up layers provided in an alternating pattern of insulation or dielectric layers 208 and conductive layers 206 (e.g., patterned electrically) forming a plurality of traces 210 between the dielectric layers 208. In some such examples, the substrate assembly 200 can include a plurality of vias (e.g., copper plated vias) that extend through one or more of the plurality of the dielectric layers 208 to electrically interconnect one or more conductive layers 206. In some examples, the substrate assembly 200 can include a plurality of solder connectors (e.g., solder balls) and a plurality of solder pads to electrically couple the substrate assembly 200 to a printed circuit board, a substrate package, an interposer and/or any other substrate(s) of a semiconductor package (e.g., the package system 100 of FIG. 1).

Figure 3:
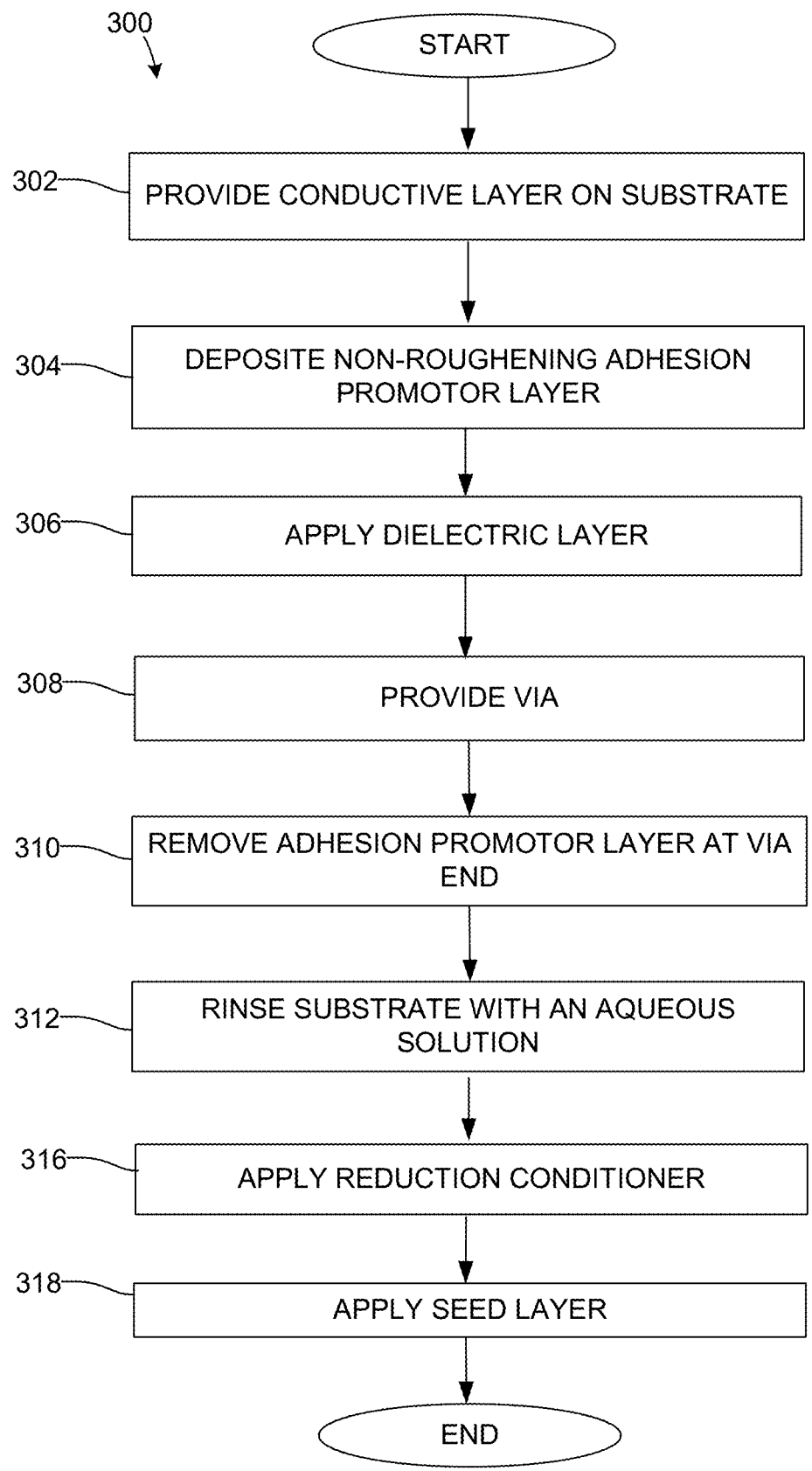
FIG. 3 is a flowchart of an example method of manufacturing an example semiconductor package and/or substrate assembly disclosed herein.

FIG. 3 is a flowchart of an example method 300 of fabricating an example substrate package disclosed herein. For example, the method 300 of FIG. 3 can be used to fabricate or create the example substrate assembly 200 and/or the package system 100 of FIG. 1. To facilitate discussion of the example method 300, the example method 300 will be described in connection with the example substrate assembly 200 of FIG. 2. For example, FIGS. 4A-4G are cross-sectional schematic illustrations of the example substrate assembly 200 of FIG. 2 at various manufacturing stages 402, 404, 406, 408, 410, 412, 414, corresponding to the example method 300 of FIG. 3. While an example manner of fabricating the example substrate assembly 200 has been illustrated in FIGS. 3 and 4A-4G, one of the operations and/or processes illustrated in FIGS. 3 and 4A-4G may be combined, divided, re-arranged, omitted, eliminated and/or implemented in any other way. Further still, the example methods of FIGS. 3 and 4A-4G may include processes and/or operations in addition to, or instead of, those illustrated in FIGS. 3 and 4A-4G and/or may include more than one of any or all of the illustrated processes and/or operations. Further, although the example methods are described with reference to the flowchart illustrated in FIG. 3 and the associated manufacturing stages represented in FIGS. 4A-4G, many other methods or processes of fabricating electronic packages may alternatively be used. The method 300 of the illustrated example is a semi-dry, semi-additive process for manufacturing the substrate assembly 200.

Figure 4A:
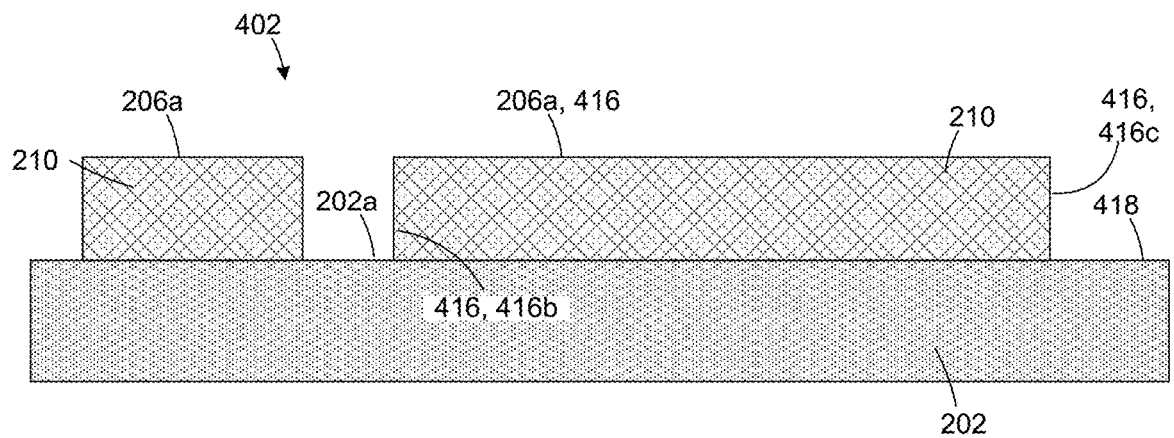
FIGS. 4A-4G depict figures showing the example substrate assembly of FIG. 2 at various manufacturing stages corresponding to the example method of FIG. 3.

Referring to the example method 300 of FIG. 3, the method 300 begins by providing a conductive layer on a substrate (block 302). For example, the conductive layer includes a smooth, non-roughened surface finish. Referring to FIG. 4A, the substrate 202 can be composed of an organic and/or inorganic material including, for example, glass, silicon, etc. In some examples, the conductive layer 206 is provided on or attached to the substrate 202 using a semi-additive process (SAP). For example, the conductive layer 206 of the illustrated example is a copper material that is provided on the first surface 202a of the substrate 202 via sputtering or sputter deposition, electro-or-electroless plating, and/or any other manufacturing technique for adding the conductive layer. In some examples, the conductive layer 206 (e.g., platted copper) can be annealed (e.g., at a temperature (e.g., 150 degrees Fahrenheit) for a duration of time (e.g., 3 hours)) after the conductive layer 206 is applied to the substrate 202.

The conductive layer 206 of the illustrated example of FIG. 4A includes a substantially smooth, non-roughened surface 414. For example, the first surface 206a of the conductive layer 206 can have a smooth surface roughness of approximately between 0.01 micrometers (μm) and 1 micrometer (μm), 1 micrometer (μm) and 3 micrometers (μm), and/or less than 5 micrometers. The conductive layer 206 can be fabricated to provide trace patterning. Thus, the conductive layer 206 can be fabricated in a pattern on the first surface 202a of the substrate 202 representative of traces. In some examples, the conductive layer 206 can be a metal or copper foil that is attached to the substrate 202.

For example, employing a semi-additive process (SAP) method to provide the conductive layer 206, a dry film resist (DFR) can be attached to the substrate 202 and subjected to printing, exposing, and developing, to provide pattern walls. Then, copper plating is performed between the pattern walls by at least one of an electroless plating method or an electrolyte plating method. Thereafter, if the circuit pattern is full-etched by a thickness of copper in a state in which the pattern walls provided of the DFR is removed, only a copper foil circuit pattern is maintained on the surface thereof. In the SAP method, the copper plating maybe performed by an electroless plating method, an electrolyte plating method, a combination thereof, and/or any other suitable manufacturing technique(s).

When coupled to the substrate 202, the conductive layer 206 has exposed portions 416 (e.g., sides) and the substrate 202 has exposed portions 418 (e.g., surfaces, an upper surface, etc.). For example, the exposed portions 416 of the conductive layer 206 includes the first surface 206a, a first side surface 416a and a second side surface 416b opposite the first side surface 416a for each of the respective traces 210. The exposed portions 418 of the substrate 202 are portions of the first surface 202a of the substrate 202 that are not covered by the conductive layer 206.

Figure 4B:
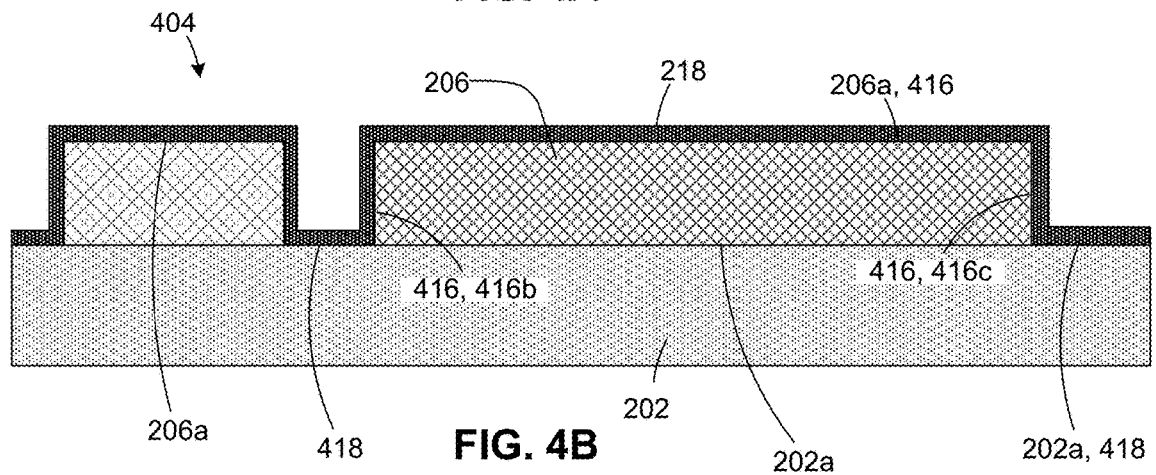

After addition of the conductive layer, an adhesion promotor layer is applied to the conductive layer (block 304). Specifically, a non-roughening, adhesion promotor film is applied to the smooth, non-roughened conductive layer (e.g., copper traces, pads, etc.). Referring to FIG. 4B, the adhesion promotor layer 218 is deposited on the conductive layer 206. Specifically, the adhesion promotor layer 218 is deposited on exposed portions 416 (e.g., surfaces) of the conductive layer 206 and exposed portions 418 of the first surface 202a of the substrate 202 (e.g., exposed upper or outer surfaces of the substrate 202 that are not covered by the conductive layer 206). For example, the adhesion promotor layer 218 of the illustrated example is a continuous layer that surrounds the first surface 206a (e.g., an upper surface), the first side surface 416a, and a second side surface 416b opposite the first side surface 416a (e.g., of each of the respective traces 210) of the conductive layer 206 and the exposed portions 418 of the substrate 202. Additionally, the adhesion promotor layer 218 of the illustrated example is a continuous layer. In other words, surface areas of exposed portions 416 (e.g., surfaces, sides, or edges) of the conductive layer 206 are fully or completely covered (e.g., encased) by the adhesion promotor layer 218 and surfaces areas of the exposed portions 418 of the substrate 202 (e.g., not covered by the conductive layer 206) are fully or completely covered by the adhesion promotor layer 218. The adhesion promotor layer 218 of the illustrated example has a thickness 419 of approximately between 1 nanometer and 10 micrometers. In some examples, the adhesion promotor layer 218 has a uniform or constant thickness. In some examples, the adhesion promotor layer 218 has a thickness that varies (e.g., between plus or minus and 0.25 micrometers) across the surface of the substrate.

Additionally, the adhesion promotor layer 218 of the illustrated example is deposited on the exposed portions 416 of the conductive layer 206 and the exposed portions 418 of the substrate 202 by sputtering using plasma vapor deposition (PVD) manufacturing techniques. A PVD process is a dry-based etching process that does not require chemicals. Employing a PVD process instead of a chemical vapor deposition (CVD) or a plasma enhanced chemical vapor deposition (PECVD) provides significant benefits. For example, the adhesion promotor layer 218 when deposited by sputtering employing PVD provides higher density compared to an adhesion promoter layer applied using CVD or PECVD. An adhesion promoter layer 218 having a higher density provides improved hermeticity characteristics to prevent oxidation (e.g., copper oxide) that can cause or initiate delamination between the conductive layer 206 and the dielectric layer 208. Additionally, the adhesion promotor layer 218, when applied via PVD compared to CVD or PECVD, significantly improves adhesion characteristics between the conductive layer 206 and the dielectric layer 208 that is subsequently laminated to the conductive layer 206. In the illustrated example, a film of SiNx is sputtered on the conductive layer 206 composed of copper (e.g., the traces and pads defined by the conductive layer 206) and the exposed portions 416 of the substrate 202. Using PVD manufacturing processes results in an absence (or negligible amounts) of hydrogen in the adhesion promotor layer 218. Thus, the adhesion promotor layer 218 of the illustrated example is substantially free of hydrogen. In some examples, the absence of hydrogen can enable a denser film and/or higher hermeticity characteristics, thereby providing qualified adhesion property. As used herein, substantially free of hydrogen includes no amounts of hydrogen, a small or insignificant amount of hydrogen, and/or any amount of hydrogen that is not detectable by scanning electron micrometry (SEM), energy-dispersive X-ray spectroscopy (EDS), x-ray photoelectron spectroscopy depth profiling (XPS), transmission electron microscope (TEM), a combination thereof, and/or any other scanner or detection system or method(s). Thus, the adhesion promotor layer 218 does not have any hydrogen or includes an amount of hydrogen that is negligible or undetectable.

Figure 4C:
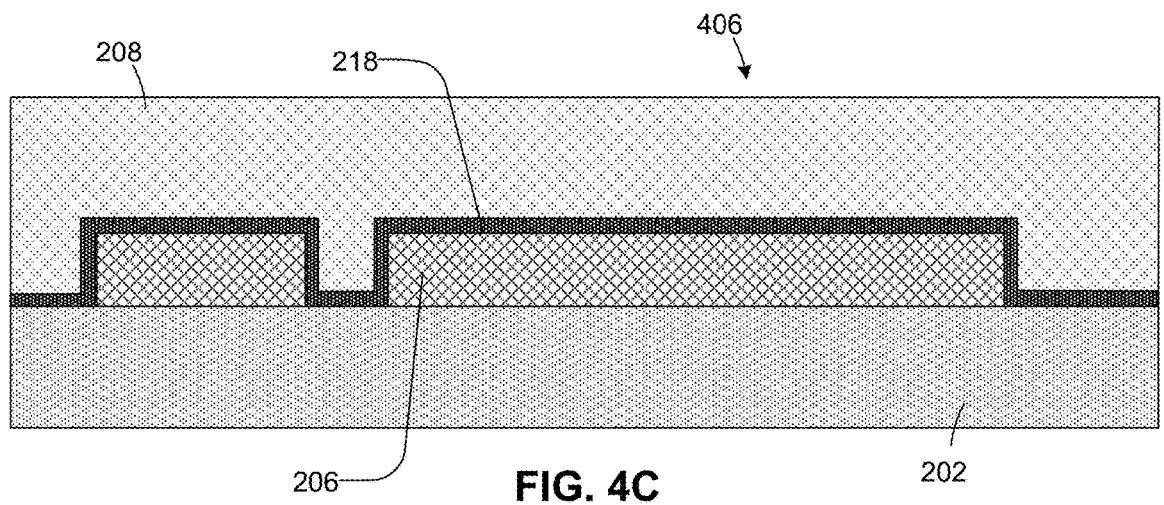
Figure 4D:
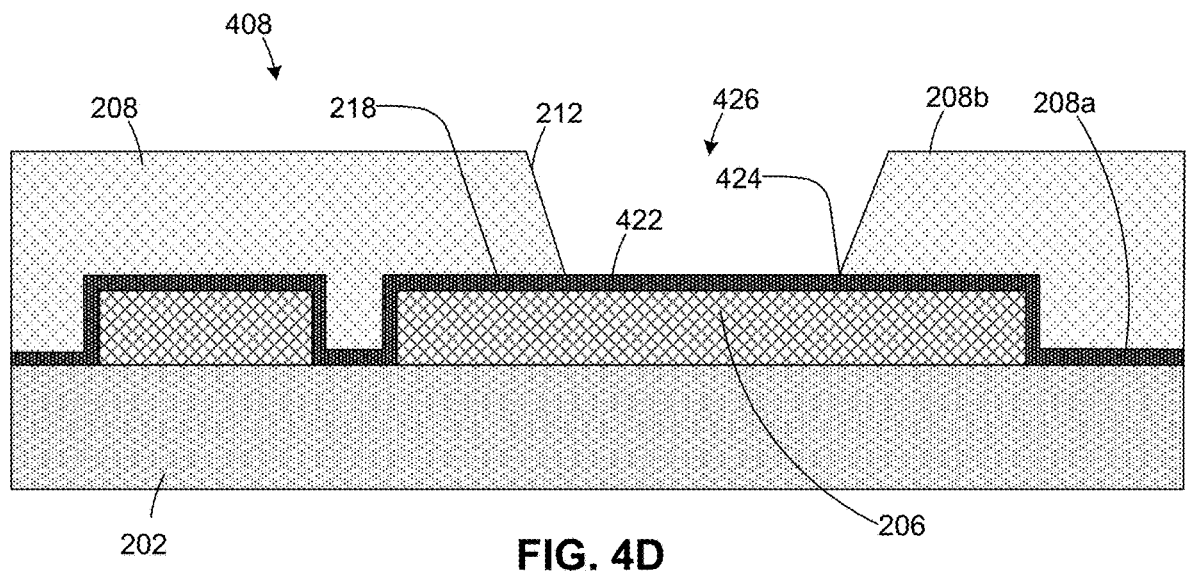

The method 300 includes laminating a dielectric layer (block 306). Referring to FIG. 4C, after the adhesion promotor layer 218 is deposited on the conductive layer 206, the dielectric layer 208 is applied to the substrate 202 and the conductive layer 206. For example, the dielectric layer 208 can be applied to the substrate 202 and the conductive layer 206 using lamination manufacturing technique(s) or process(es). For example, a lamination process includes using heat and pressure. In the illustrated example of FIG. 4C, the dielectric layer 208 is laminated on the SiNx coated traces and/or pads defined by the conductive layer 206. The adhesion promotor layer 218 improves and/or enables adhesion between the dielectric layer 208 and the conductive layer 206. Specifically, the conductive layer 206 is a relatively smooth, non-roughed conductive or metal layer. In other words, the example method 300 does not include a mechanical, a chemical and/or other roughing manufacturing techniques that would otherwise be needed to roughen the surface of the conductive layer 206 to promote adhesion between the dielectric layer 2087 and the conductive layer 206. For example, some known processes attach a copper foil on the conductive layer to provide a roughened surface to promote adhesion between the dielectric layer 208 and the conductive layer 206. As noted above, no such surface roughening of the conductive layer 206 is needed in the example method 300 of FIG. 3. To this end, in some examples, the dielectric layer 208 is applied to the conductive layer 206 without any additional intervening processes or methods (e.g., directly after addition of the conductive layer 206). The conductive layer 206 has a relatively smooth surface finish having crevices of approximately between 0.1 micrometers ($\mu$m) and 3 micrometers ($\mu$m), or less than approximately 4 micrometers.

After the dielectric layer is laminated with the conductive layer, a via is provided (block 308). For example, referring to FIG. 4D, the via 212 is provided in the dielectric layer 208 after the dielectric layer 208 is laminated with the conductive layer 206 and the substrate 202. The via 212 of the illustrated example can be provided via drilling. For example, the via 212 of the illustrated example can be provided using carbon dioxide ($CO_2$) or ultra-violet (UV) drilling manufacturing techniques and/or processes. The via 212 of the illustrated example extends between the first side 208a and the second side 208b of the dielectric layer 208. For example, the via 212 extends through the dielectric layer 208 to the first side 218a of the adhesion promotor layer 218. In the illustrated example, a portion 422 of the adhesion promotor layer 218 is exposed in the via 212 (e.g., at an end 424 of the via 212). In other words, the exposed portion 422 of the adhesion promotor layer 218 is in communication with an opening or cavity 426 of the via 212.

Figure 4E:
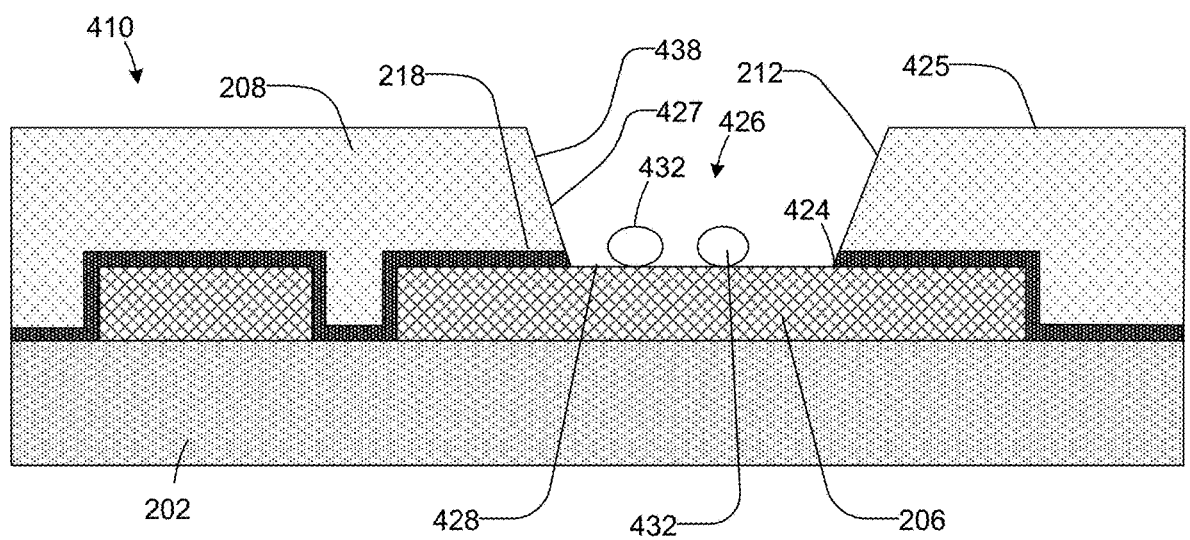

After fabrication of the via, the adhesion promotor layer is removed (e.g., etched) from the via (block 310). Referring to FIG. 4E, after drilling the via 212, the exposed portion 422 (FIG. 4D) of the adhesion promotor layer 218 in the via 212 is removed (e.g., from an end 424 (e.g., a bottom end in the orientation of FIG. 4E) of the via 216). Specifically, a dry desmear process is performed to remove or etch the exposed portion 422 of the adhesion promotor layer 218. In other words, removal of the exposed portion 422 of the adhesion promotor layer 218 at the end 424 of the via 212 uncovers a portion 428 of the conductive layer 206 in the via 212. The dry desmear process is a plasma-based, dry etching process for removing or etching material. A dry desmear process is employed because (1) a wet desmear process may not be effective in removing the exposed portion 422 of the adhesion promotor layer 218 (e.g., the SiNx film) at the end 424 of the via 212, and/or (2) chemicals used in a wet desmear manufacturing process can induce delamination between an adhesion promotor/dielectric interface. Thus, employing a dry desmear process prevents delamination issues at the adhesion promotor/dielectric interface that may otherwise occur when using a wet desmear process. Additionally, the dry desmear process can clean or remove (e.g., etches) any residual dielectric material(s) 432 remaining in the via 212 (e.g., at the end 424 of the via 212). For instance, the residual dielectric material 432 may result from drilling the via 212 at block 308.

After the adhesion promotor layer and/or the residual dielectric material is removed from the via at block 310, the substrate assembly 410 is rinsed or cleaned with an aqueous solution (block 312). In some examples, the dielectric layer 208 and/or plasma material(s) used during dry desmear processes can contain fluorine (F), which can settle in the via 212 and/or the end 424 of the via 212 (e.g., on the uncovered portion 428 of the conductive layer 206 in communication with the cavity 426). Fluorine material remaining on the conductive layer 206 (e.g., on top of the copper (Cu) surface) at the end 424 of the via 212 can compromise adhesion of downstream or subsequent seed layer applications, thereby causing the seed layer from properly attaching to walls of the via 216 and/or the uncovered portion 428 (e.g., the upper copper surface) of the conductive layer 206, which can lead to interfacial delamination/reliability issues between a conductive layer/seed layer interface. In some instances, fluorine (F) residual in between interconnect layers could potentially cause short circuit of a die (e.g., of an Embedded Multi-Die Interconnect Bridge (EMIB) of a die). Thus, rinsing and/or cleaning manufacturing processes of the via 212 as disclosed herein improves downstream manufacturing and/or product reliability. In the illustrated example, fluorine material is substantially removed from at least a surface 425 (e.g., an upper surface in the orientation of FIG. 4E) of the dielectric layer 208, a surface 427 of the dielectric layer 208 defining a via wall 438, and/or the uncovered portion 428 of the conductive layer 206 in communication with the via 212. Thus, the dielectric layer 208 (e.g., surfaces 425, 427 of the dielectric layer 208), the via wall 438, and/or the conductive layer 206 (e.g., the uncovered portion 428 of the conductive layer 206) are substantially free of fluorine. As used herein, substantially free of fluorine includes no amounts of fluorine and/or a small or insignificant amount of fluorine or any amount of fluorine that does not cause delamination between the dielectric layer 208 and the conductive layer 206.

Figure 4F:
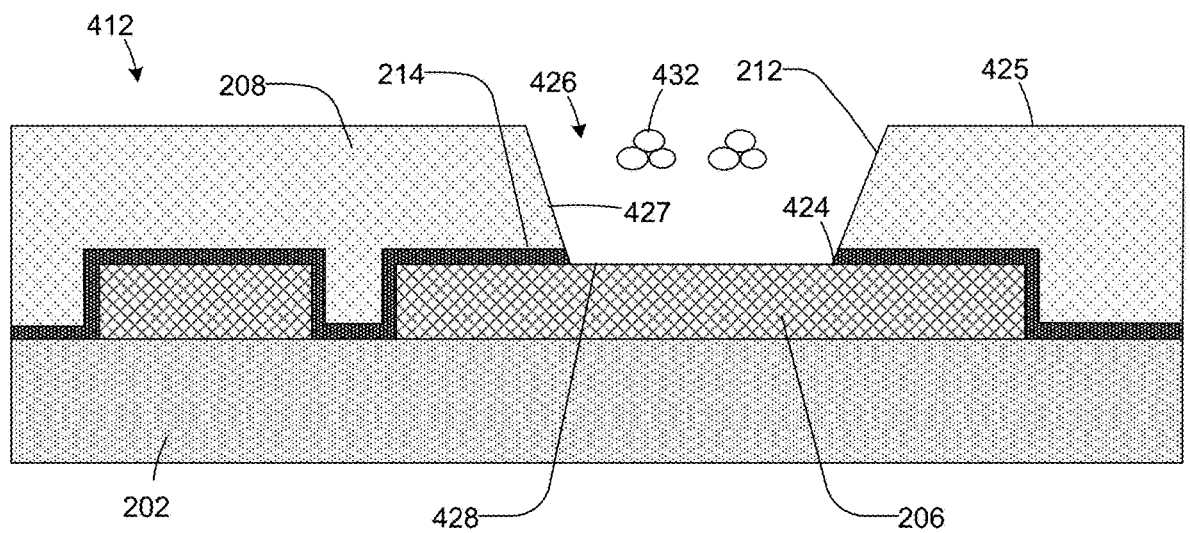

Referring to FIG. 4F, the substrate assembly 410 is rinsed or cleaned after the dry desmear process to remove other residual material(s) (e.g., including fluorine (F)) remaining at the end of the via 212 and/or on the uncovered portion 428 of the conductive layer 206 in the via 212. For example, loosely-bonded particles 432 may remain at the end 424 of the via 212 (e.g., on the portion 428 of the conductive layer 206) after the dry desmear manufacturing process. The rinsing process performed at block 312 is performed to remove fluorine (F) from the end of the via 216 and/or the substrate assembly 200 that may otherwise remain after the removal or etching process of block 310.

In some examples, the aqueous solution includes applying or subjecting the substrate assembly 412 with a hot water rinse for a duration a of time. For example, the substrate assembly 412 of the illustrated example can be exposed to (e.g., immersed in) a hot water rinse or bath having a temperature of approximately 70 degrees Celsius (° C.) or greater for a period of time (e.g., between 5 seconds and 5 minutes, etc.) sufficient to remove any undesirable dry etch residues (e.g., fluorine) from a surface of the substrate assembly 412. For example, the water can be deionized water. Removal of fluorine is much more rapid when using hot water (e.g., water having a temperature of approximately 70° C. or greater) compared to a water rinse having room temperature (e.g., a temperature of approximately 20° C.). Specifically, surficial fluorine (F) protonated by the hot water rinse creates volatile hydrogen fluoride (HF) for fluorine (F) removal. Specifically, when a solution or rinse is applied to the substrate assembly 412 of FIG. 4F, water molecules ($H_2O$) and fluorine molecules on the surface of the conductive layer 206 (e.g., copper layer) react such that oxygen and hydrogen molecules (e.g., hydroxide) remain on the conductive layer 206 and hydrogen fluorine molecules are removed from the conductive layer 206. Thus, after rinsing, substantially no fluorine is present. For example, after dry etching and/or dry desmear, fluoride residue can be approximately 2.9 atomic percent at an edge (e.g., an edge of the bottom surface) of the via 212 and approximately 1.92 atomic percent at a center (e.g., a center of a bottom surface) of the via 212. After rinsing at block 312, no fluorine or negligible amount of fluorine is present at the edge and the center of the via 212. In some examples, the aqueous solution can include hot water and acid. In some examples, the hot water and acid are combined in a mixture. In some examples, the hot water is applied prior to or after application of the acid. In some examples, the hot water is provided both before and after application of the acid.

After rinsing, a reduction conditioner treatment is provided (block 316). The reduction conditioner of the illustrated example is an acid that can include sulfuric acid ($H_2SO_4$), formic acid and/or any other suitable acid solution. The reduction conditioner of the illustrated example can be an acid rinse or bath provided for a desired duration of time (e.g., between approximately 5 seconds and 60 seconds). For example, after rinsing with the aqueous solution at block 312, copper (II) hydroxide Cu(OH)2 precipitates can remain on the conductive layer 206, the via 212 and/or other surfaces of the substrate assembly 412. Remaining copper (II) hydroxide Cu(OH)2 precipitates are removed by exposure to the reduction conditioner (e.g., an acid rinse or bath) for a duration of time (e.g., between approximately 5 seconds and 60 seconds).

Figure 4G:
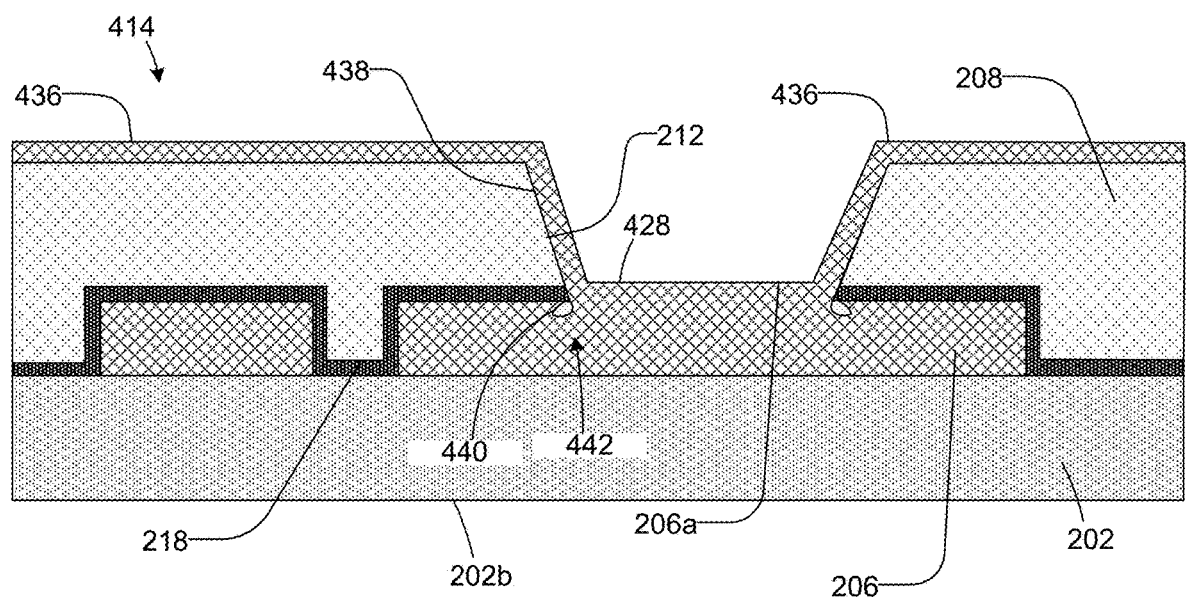

A seed layer is then applied (block 318). Referring to FIG. 4G, a seed layer 436 is applied to the substrate assembly 412 of FIG. 4F. The seed layer 436 of the illustrated example is the second conductive layer 214 (e.g., a copper layer) that is added to the substrate assembly 412. For example, the seed layer 436 is provided on the first side 208a of the dielectric layer 208, on an inner surface (e.g., the wall 438) of the via 212, and the portion 428 of the conductive layer 206 in communication with the via 212 (e.g., the inner surface or wall 438 of the via 212). Removal of the portion 422 of the adhesion promotor layer 218 from the portion 428 of the conductive layer 206 in communication with the via 212 enables the seed layer 436 to bond directly to the first surface 206a of the portion 428 of the conductive layer 206.

Additionally, the seed layer 436 of the illustrated example is provided using an electroless seed deposition manufacturing process. An electroless seed deposition manufacturing technique is significantly less costly than, for example, other sputter deposition manufacturing technique(s) including, for example, a sputtered titanium (Ti)/Copper (Cu) seed layer and other sputter deposition manufacturing technique(s). Thus, employing electroless seed deposition to deposit the seed layer 436 reduces manufacturing costs and/or improves manufacturing efficiency. As described above, the dielectric layer 208 and/or the conductive layer 206 of the illustrated example located within the via 212 (e.g., a perimeter of the via 212) are substantially free of fluorine residue. As a result, substantially fluorine free surfaces significantly enhance adhesion promotion between the second conductive layer 214 and the first conductive layer 206 when applying the second conductive layer 214 using electro or electro-less seed deposition manufacturing techniques. Additionally, electro or electro-less (e-less) deposition causes an undercut 440 (e.g., a void, an annular void, a channel) at an interface 442 between the first conductive layer 206 and the second conductive layer 214. The undercut 440 does not affect adhesion characteristics and/or does not cause delamination issues at the interface 442.

As illustrated in FIG. 4G, the conductive layer 206 has a smooth, non-roughened surface (e.g., less than 5 micrometers), the adhesion promotor layer 218 is substantially free of (e.g., has an absence of) hydrogen as a result of employing plasma vapor deposition manufacturing processes (e.g., compared to CVD processes which result in the addition of hydrogen) to provide the adhesion promotor layer 218, at least the conductive layer 206, the dielectric layer 208, and/or the via 212, or portions thereof, are substantially free of (e.g., have an absence of) fluorine as a result of rinsing the substrate assembly 412 with a rinse solution (e.g., hot water and acid and/or the reduction conditioner), and the interface 442 between the first conductive layer 206 and the second conductive layer 214 (e.g., the seed layer 436) has the undercut 440 as a result of applying the second conductive layer 214 using electro or electroless plating manufacturing processes.

Although not shown, further processing of the substrate can be performed using semi-additive process (SAP) and/or conventional semiconductor manufacturing techniques or processes including, but not limited to photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices. For example, other build-up layers 204 can be provided on the substrate 202. In some examples, during further processing, additional (e.g., two or more) of the dielectric layers 208 and/or conductive layers 206 (e.g., build-up layers 204) can be provided on the first side 208a of the dielectric layer 208, the seed layer 436, and/or the second surface 202b of the substrate 202. For example, a conductive platting layer (e.g., the conductive filler layer 220 of FIG. 2) is provided on the seed layer 436 and/or within the via 212 during subsequent manufacturing processes.

The example substrate assembly 200 disclosed herein may be included in any suitable electronic component. FIGS. 5-9 illustrate various examples of apparatus that may include or be included in the substrate assembly 200 disclosed herein.

Figure 5:
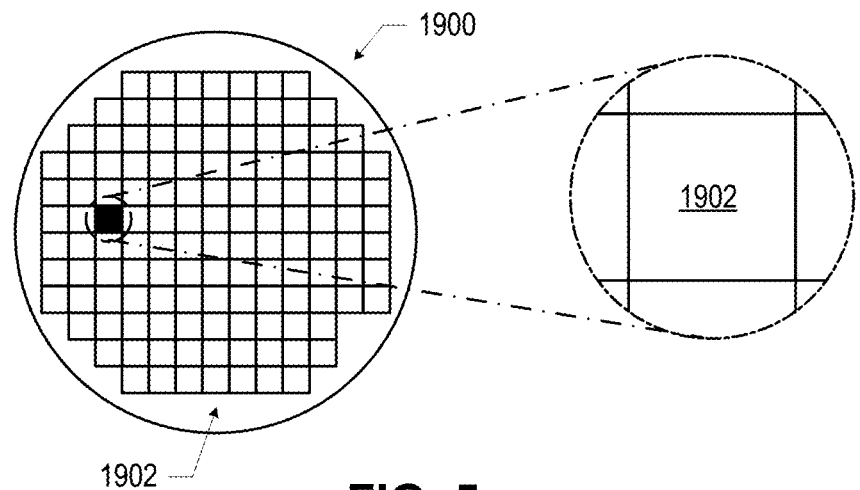
FIG. 5 is a top view of a wafer and dies that may be included in an IC package constructed in accordance with teachings disclosed herein.

FIG. 5 is a top view of a wafer 1900 and dies 1902 that may be included in an IC package whose substrate includes one or more substrate assembly 200 (e.g., as discussed below with reference to FIG. 7) in accordance with any of the examples disclosed herein. The wafer 1900 may be composed of semiconductor material and may include one or more dies 1902 having IC structures formed on a surface of the wafer 1900. Each of the dies 1902 may be a repeating unit of a semiconductor product that includes any suitable IC. After the fabrication of the semiconductor product is complete, the wafer 1900 may undergo a singulation process in which the dies 1902 are separated from one another to provide discrete "chips" of the semiconductor product. The die 1902 may include one or more transistors (e.g., some of the transistors 2040 of FIG. 6, discussed below), supporting circuitry to route electrical signals to the transistors, passive components (e.g., signal traces, resistors, capacitors, or inductors), and/or any other IC components. In some examples, the wafer 1900 or the die 1902 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1902. For example, a memory array formed by multiple memory devices may be formed on a same die 1902 as a processing device (e.g., the processing device 2302 of FIG. 9) or other logic that is configured to store information in the memory devices or execute instructions stored in the memory array. The example substrate assembly 200 disclosed herein may be manufactured using a die-to-wafer assembly technique in which some dies are attached to a wafer 1900 that include others of the dies, and the wafer 1900 is subsequently singulated.

Figure 6:
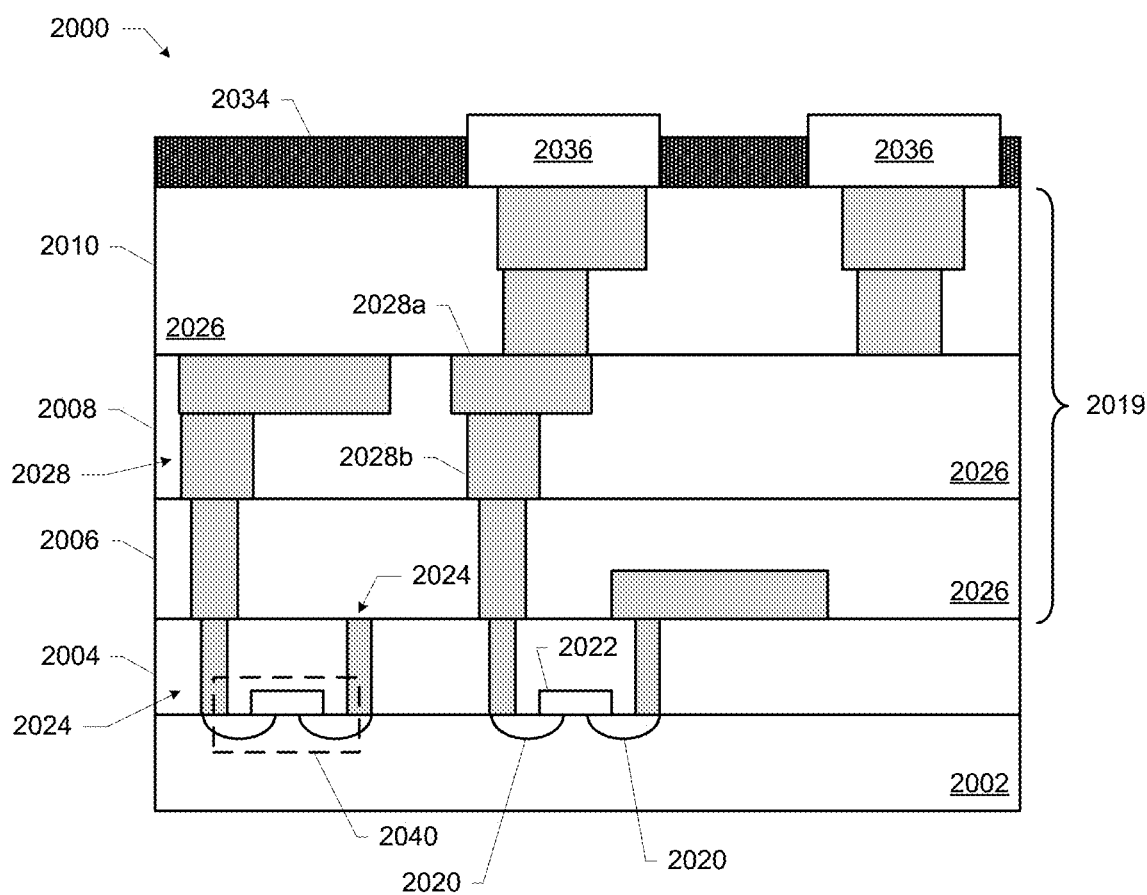
FIG. 6 is a cross-sectional side view of an IC device that may be included in an IC package constructed in accordance with teachings disclosed herein.

FIG. 6 is a cross-sectional side view of an IC device 2000 that may be included in an IC package whose substrate includes one or more substrate assemblies 200 (e.g., as discussed below with reference to FIG. 7), in accordance with any of the examples disclosed herein. One or more of the IC devices 2000 may be included in one or more dies 1902 (FIG. 5). The IC device 2000 may be formed on a die substrate 2002 (e.g., the wafer 1900 of FIG. 5) and may be included in a die (e.g., the die 1902 of FIG. The die substrate 2002 may be a semiconductor substrate composed of semiconductor material systems including, for example, n-type or p-type materials systems (or a combination of both). The die substrate 2002 may include, for example, a crystalline substrate formed using a bulk silicon or a silicon-on-insulator (SOI) substructure. In some examples, the die substrate 2002 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the die substrate 2002. Although a few examples of materials from which the die substrate 2002 may be formed are described here, any material that may serve as a foundation for an IC device 2000 may be used. The die substrate 2002 may be part of a singulated die (e.g., the dies 1902 of FIG. 5) or a wafer (e.g., the wafer 1900 of FIG. 5).

The IC device 2000 may include one or more device layers 2004 disposed on the die substrate 2002. The device layer 2004 may include features of one or more transistors 2040 (e.g., metal oxide semiconductor field-effect transistors (MOSFETs)) formed on the die substrate 2002. The device layer 2004 may include, for example, one or more source and/or drain (S/D) regions 2020, a gate 2022 to control current flow in the transistors 2040 between the S/D regions 2020, and one or more S/D contacts 2024 to route electrical signals to/from the S/D regions 2020. The transistors 2040 may include additional features not depicted for the sake of clarity, such as device isolation regions, gate contacts, and the like. The transistors 2040 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 2040 may include a gate 2022 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 2040 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 2040 along the source-channel-drain direction, the gate electrode may consist of a U-shaped structure that includes a bottom portion substantially parallel to the surface of the die substrate 2002 and two sidewall portions that are substantially perpendicular to the top surface of the die substrate 2002. In other examples, at least one of the metal layers that form the gate electrode may simply be a planar layer that is substantially parallel to the top surface of the die substrate 2002 and does not include sidewall portions substantially perpendicular to the top surface of the die substrate 2002. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 2020 may be formed within the die substrate 2002 adjacent to the gate 2022 of each transistor 2040. The S/D regions 2020 may be formed using an implantation/diffusion process or an etching/deposition process, for example. In the former process, dopants such as boron, aluminum, antimony, phosphorous, or arsenic may be ion-implanted into the die substrate 2002 to form the S/D regions 2020. An annealing process that activates the dopants and causes them to diffuse farther into the die substrate 2002 may follow the ion-implantation process. In the latter process, the die substrate 2002 may first be etched to form recesses at the locations of the S/D regions 2020. An epitaxial deposition process may then be carried out to fill the recesses with material that is used to fabricate the S/D regions 2020. In some implementations, the S/D regions 2020 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 2020 may be formed using one or more alternate semiconductor materials such as germanium or a group III-V material or alloy. In further examples, one or more layers of metal and/or metal alloys may be used to form the S/D regions 2020.

Electrical signals, such as power and/or input/output (I/O) signals, may be routed to and/or from the devices (e.g., transistors 2040) of the device layer 2004 through one or more interconnect layers disposed on the device layer 2004 (illustrated in FIG. 6 as interconnect layers 2006-2010). For example, electrically conductive features of the device layer 2004 (e.g., the gate 2022 and the S/D contacts 2024) may be electrically coupled with the interconnect structures 2028 of the interconnect layers 2006-2010. The one or more interconnect layers 2006-2010 may form a metallization stack (also referred to as an "ILD stack") 2019 of the IC device 2000.

The interconnect structures 2028 may be arranged within the interconnect layers 2006-2010 to route electrical signals according to a wide variety of designs (in particular, the arrangement is not limited to the particular configuration of interconnect structures 2028 depicted in FIG. 6). Although a particular number of interconnect layers 2006-2010 is depicted in FIG. 6, examples of the present disclosure include IC devices having more or fewer interconnect layers than depicted.

In some examples, the interconnect structures 2028 may include lines 2028a and/or vias 2028b filled with an electrically conductive material such as a metal. The lines 2028a may be arranged to route electrical signals in a direction of a plane that is substantially parallel with a surface of the die substrate 2002 upon which the device layer 2004 is formed. For example, the lines 2028a may route electrical signals in a direction in and out of the page from the perspective of FIG. 6. The vias 2028b may be arranged to route electrical signals in a direction of a plane that is substantially perpendicular to the surface of the die substrate 2002 upon which the device layer 2004 is formed. In some examples, the vias 2028b may electrically couple lines 2028a of different interconnect layers 2006-2010 together.

The interconnect layers 2006-2010 may include a dielectric material 2026 disposed between the interconnect structures 2028, as shown in FIG. 6. In some examples, the dielectric material 2026 disposed between the interconnect structures 2028 in different ones of the interconnect layers 2006-2010 may have different compositions; in other examples, the composition of the dielectric material 2026 between different interconnect layers 2006-2010 may be the same.

A first interconnect layer 2006 (referred to as Metal 1 or "M1") may be formed directly on the device layer 2004. In some examples, the first interconnect layer 2006 may include lines 2028a and/or vias 2028b, as shown. The lines 2028a of the first interconnect layer 2006 may be coupled with contacts (e.g., the S/D contacts 2024) of the device layer 2004.

A second interconnect layer 2008 (referred to as Metal 2 or "M2") may be formed directly on the first interconnect layer 2006. In some examples, the second interconnect layer 2008 may include vias 2028b to couple the lines 2028a of the second interconnect layer 2008 with the lines 2028a of the first interconnect layer 2006. Although the lines 2028a and the vias 2028b are structurally delineated with a line within each interconnect layer (e.g., within the second interconnect layer 2008) for the sake of clarity, the lines 2028a and the vias 2028b may be structurally and/or materially contiguous (e.g., simultaneously filled during a dual-damascene process) in some examples.

A third interconnect layer 2010 (referred to as Metal 3 or "M3") (and additional interconnect layers, as desired) may be formed in succession on the second interconnect layer 2008 according to similar techniques and configurations described in connection with the second interconnect layer 2008 or the first interconnect layer 2006. In some examples, the interconnect layers that are "higher up" in the metallization stack 2019 in the IC device 2000 (i.e., further away from the device layer 2004) may be thicker.

The IC device 2000 may include a solder resist material 2034 (e.g., polyimide or similar material) and one or more conductive contacts 2036 formed on the interconnect layers 2006-2010. In FIG. 6, the conductive contacts 2036 are illustrated as taking the form of bond pads. The conductive contacts 2036 may be electrically coupled with the interconnect structures 2028 and configured to route the electrical signals of the transistor(s) 2040 to other external devices. For example, solder bonds may be formed on the one or more conductive contacts 2036 to mechanically and/or electrically couple a chip including the IC device 2000 with another component (e.g., a circuit board). The IC device 2000 may include additional or alternate structures to route the electrical signals from the interconnect layers 2006-2010; for example, the conductive contacts 2036 may include other analogous features (e.g., posts) that route the electrical signals to external components.

Figure 7:
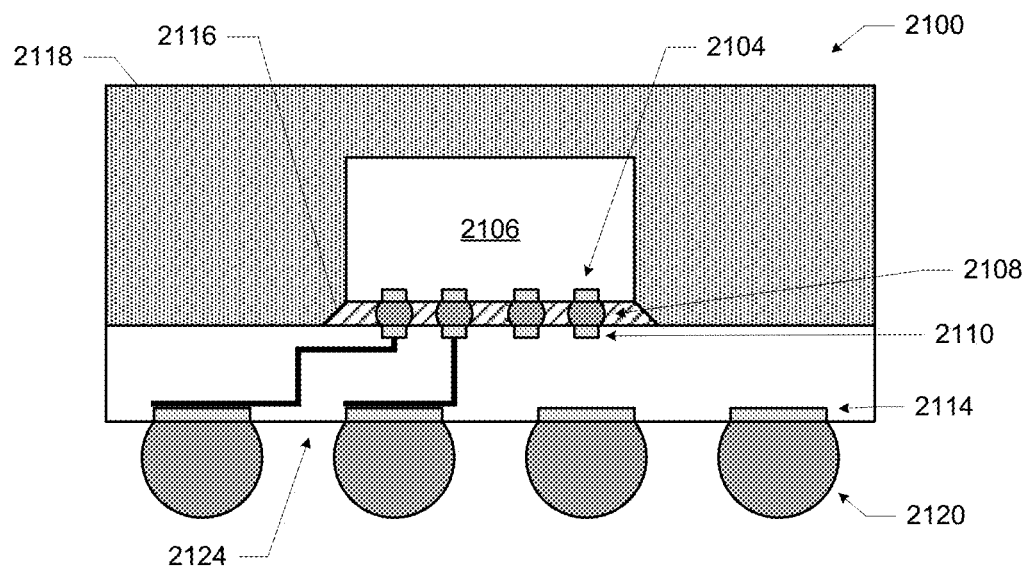
FIG. 7 is a cross-sectional side view of an IC package that may include a substrate assembly, in accordance with various examples.

FIG. 7 is a cross-sectional view of an example IC package 2100 that may include one or more substrate assemblies 200. The package substrate 2102 may be formed of a dielectric material, and may have conductive pathways extending through the dielectric material between upper and lower faces 2122, 2124, or between different locations on the upper face 2122, and/or between different locations on the lower face 2124. These conductive pathways may take the form of any of the interconnects 2028 discussed above with reference to FIG. 6. In some examples, any number of substrate assemblies 200 (with any suitable structure) may be included in a package substrate 2102. In some examples, no substrate assembly 200 may be included in the package substrate 2102.

The IC package 2100 may include a die 2106 coupled to the package substrate 2102 via conductive contacts 2104 of the die 2106, first-level interconnects 2108, and conductive contacts 2110 of the package substrate 2102. The conductive contacts 2110 may be coupled to conductive pathways 2112 through the package substrate 2102, allowing circuitry within the die 2106 to electrically couple to various ones of the conductive contacts 2114 or to the substrate assembly 200 (or to other devices included in the package substrate 2102, not shown). The first-level interconnects 2108 illustrated in FIG. 7 are solder bumps, but any suitable first-level interconnects 2108 may be used. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket).

In some examples, an underfill material 2116 may be disposed between the die 2106 and the package substrate 2102 around the first-level interconnects 2108, and a mold compound 2118 may be disposed around the die 2106 and in contact with the package substrate 2102. In some examples, the underfill material 2116 may be the same as the mold compound 2118. Example materials that may be used for the underfill material 2116 and the mold compound 2118 are epoxy mold materials, as suitable. Second-level interconnects 2120 may be coupled to the conductive contacts 2114. The second-level interconnects 2120 illustrated in FIG. 7 are solder balls (e.g., for a ball grid array arrangement), but any suitable second-level interconnects 2120 may be used (e.g., pins in a pin grid array arrangement or lands in a land grid array arrangement). The second-level interconnects 2120 may be used to couple the IC package 2100 to another component, such as a circuit board (e.g., a motherboard), an interposer, or another IC package, as known in the art and as discussed below with reference to FIG. 7.

In FIG. 7, the IC package 2100 is a flip chip package, and includes a substrate assembly 200 in the package substrate 2102. The number and location of the substrate assembly 200 in the package substrate 2102 of the IC package 2100 is simply illustrative, and any number of substrate assemblies 200 (with any suitable structure) may be included in a package substrate 2102. In some examples, no substrate assembly 200 may be included in the package substrate 2102. The die 2106 may take the form of any of the examples of the die 2302 discussed herein (e.g., may include any of the examples of the IC device 2000). In some examples, the die 2106 may include one or more substrate assemblies 200 (e.g., as discussed above with reference to FIG. 5 and FIG. 6); in other examples, the die 2106 may not include any substrate assembly 200.

Although the IC package 2100 illustrated in FIG. 7 is a flip chip package, other package architectures may be used. For example, the IC package 2100 may be a ball grid array (BGA) package, such as an embedded wafer-level ball grid array (eWLB) package. In another example, the IC package 2100 may be a wafer-level chip scale package (WLCSP) or a panel fanout (FO) package. Although a single die 2106 is illustrated in the IC package 2100 of FIG. 7, an IC package 2100 may include multiple dies 2106 (e.g., with one or more of the multiple dies 2106 coupled to substrate assembly 200 included in the package substrate 2102). An IC package 2100 may include additional passive components, such as surface-mount resistors, capacitors, and inductors disposed on the first face 2122 or the second face 2124 of the package substrate 2102. More generally, an IC package 2100 may include any other active or passive components known in the art.

Figure 8:
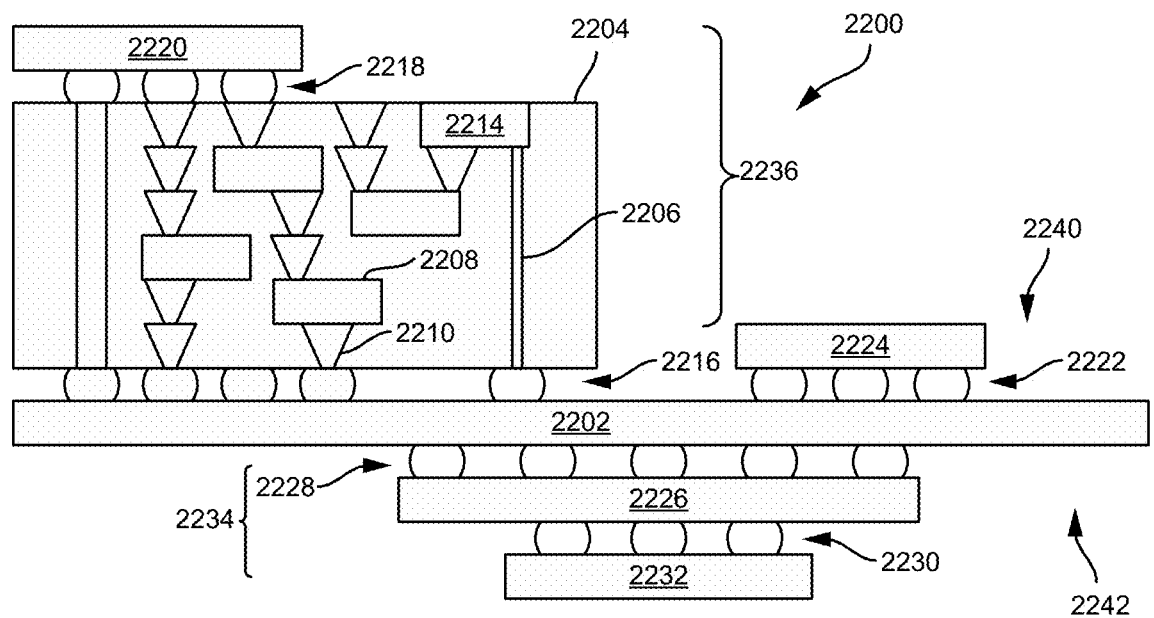
FIG. 8 is a cross-sectional side view of an IC device assembly that may include an IC package constructed in accordance with teachings disclosed herein.

FIG. 8 is a cross-sectional side view of an IC device assembly 2200 that may include the substrate assembly 200 disclosed herein. In some examples, the IC device assembly corresponds to the substrate assembly 200. The IC device assembly 2200 includes a number of components disposed on a circuit board 2202 (which may be, for example, a motherboard). The IC device assembly 2200 includes components disposed on a first face 2240 of the circuit board 2202 and an opposing second face 2242 of the circuit board 2202; generally, components may be disposed on one or both faces 2240 and 2242.

In some examples, the circuit board 2202 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2202. In other examples, the circuit board 2202 may be a non-PCB substrate.

The IC device assembly 2200 illustrated in FIG. 8 includes a package-on-interposer structure 2236 coupled to the first face 2240 of the circuit board 2202 by coupling components 2216. The coupling components 2216 may electrically and mechanically couple the package-on-interposer structure 2236 to the circuit board 2202, and may include solder balls (as shown in FIG. 8), male and female portions of a socket, an adhesive, an underfill material, and/or any other suitable electrical and/or mechanical coupling structure.

The package-on-interposer structure 2236 may include an IC package 2220 coupled to an interposer 2204 by coupling components 2218. The coupling components 2218 may take any suitable form for the application, such as the forms discussed above with reference to the coupling components 2216. Although a single IC package 2220 is shown in FIG. 8, multiple IC packages may be coupled to the interposer 2204; indeed, additional interposers may be coupled to the interposer 2204. The interposer 2204 may provide an intervening substrate used to bridge the circuit board 2202 and the IC package 2220. The IC package 2220 may be or include, for example, a die (the die 1902 of FIG. 5), an IC device (e.g., the IC device 2000 of FIG. 6), or any other suitable component. Generally, the interposer 2204 may spread a connection to a wider pitch or reroute a connection to a different connection. For example, the interposer 2204 may couple the IC package 2220 (e.g., a die) to a set of BGA conductive contacts of the coupling components 2216 for coupling to the circuit board 2202. In the example illustrated in FIG. 8, the IC package 2220 and the circuit board 2202 are attached to opposing sides of the interposer 2204; in other examples, the IC package 2220 and the circuit board 2202 may be attached to a same side of the interposer 2204. In some examples, three or more components may be interconnected by way of the interposer 2204.

In some examples, the interposer 1704 may be formed as a PCB, including multiple metal layers separated from one another by layers of dielectric material and interconnected by electrically conductive vias. In some examples, the interposer 1704 may be formed of an epoxy resin, a fiberglass-reinforced epoxy resin, an epoxy resin with inorganic fillers, a ceramic material, or a polymer material such as polyimide. In some examples, the interposer 2204 may be formed of alternate rigid or flexible materials that may include the same materials described above for use in a semiconductor substrate, such as silicon, germanium, and other group III-V and group IV materials. The interposer 2204 may include metal interconnects 2208 and vias 2210, including but not limited to through-silicon vias (TSVs) 2206. The interposer 2204 may further include embedded devices 2214, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2204. The package-on-interposer structure 2236 may take the form of any of the package-on-interposer structures known in the art.

The IC device assembly 2200 may include an IC package 2224 coupled to the first face 2240 of the circuit board 2202 by coupling components 2222. The coupling components 2222 may take the form of any of the examples discussed above with reference to the coupling components 2216, and the IC package 2224 may take the form of any of the examples discussed above with reference to the IC package 2220.

The IC device assembly 2200 illustrated in FIG. 8 includes a package-on-package structure 2234 coupled to the second face 2242 of the circuit board 2202 by coupling components 2228. The package-on-package structure 2234 may include a first IC package 2226 and a second IC package 2232 coupled together by coupling components 2230 such that the first IC package 2226 is disposed between the circuit board 2202 and the second IC package 2232. The coupling components 2228, 2230 may take the form of any of the examples of the coupling components 2216 discussed above, and the IC packages 2226, 2232 may take the form of any of the examples of the IC package 2220 discussed above. The package-on-package structure 2234 may be configured in accordance with any of the package-on-package structures known in the art.

Figure 9:
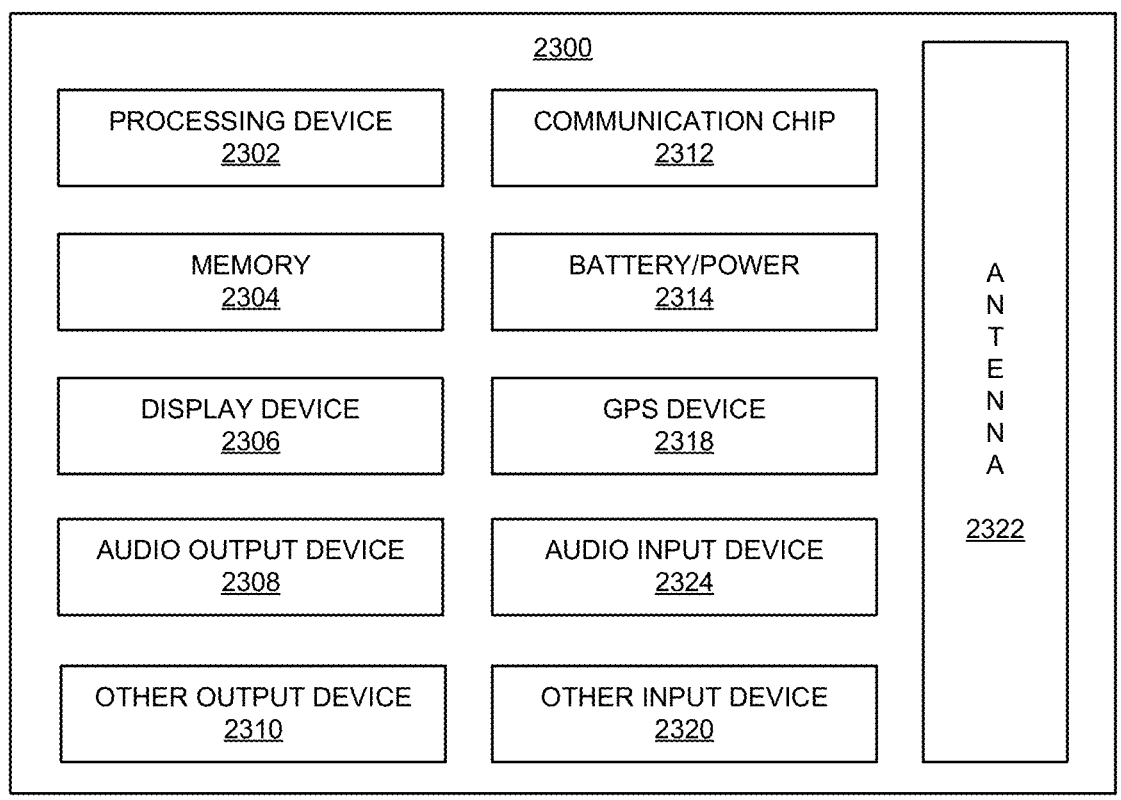
FIG. 9 is a block diagram of an example electrical device that may include an IC package constructed in accordance with teachings disclosed herein.

FIG. 9 is a block diagram of an example electrical device 2300 that may include one or more of the example substrate assemblies 200. For example, any suitable ones of the components of the electrical device 2300 may include one or more of the device assemblies 2200, IC devices 2000, or dies 1902 disclosed herein, and may be arranged in the example substrate assembly 200. A number of components are illustrated in FIG. 9 as included in the electrical device 2300, but any one or more of these components may be omitted or duplicated, as suitable for the application. In some examples, some or all of the components included in the electrical device 2300 may be attached to one or more motherboards. In some examples, some or all of these components are fabricated onto a single system-on-a-chip (SoC) die.

Additionally, in various examples, the electrical device 2300 may not include one or more of the components illustrated in FIG. 9, but the electrical device 2300 may include interface circuitry for coupling to the one or more components. For example, the electrical device 2300 may not include a display device 2306, but may include display device interface circuitry (e.g., a connector and driver circuitry) to which a display device 2306 may be coupled. In another set of examples, the electrical device 2300 may not include an audio input device 2324 or an audio output device 2308, but may include audio input or output device interface circuitry (e.g., connectors and supporting circuitry) to which an audio input device 2324 or audio output device 2308 may be coupled.

The electrical device 2300 may include a processing device 2302 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2302 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 2300 may include a memory 2304, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 2304 may include memory that shares a die with the processing device 2302. This memory may be used as cache memory and may include embedded dynamic random access memory (eDRAM) or spin transfer torque magnetic random access memory (STT-MRAM).

In some examples, the electrical device 2300 may include a communication chip 2312 (e.g., one or more communication chips). For example, the communication chip 2312 may be configured for managing wireless communications for the transfer of data to and from the electrical device 2300. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 2312 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2312 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2312 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2312 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2312 may operate in accordance with other wireless protocols in other examples. The electrical device 2300 may include an antenna 2322 to facilitate wireless communications and/or to receive other wireless communications (such as AM or FM radio transmissions).

In some examples, the communication chip 2312 may manage wired communications, such as electrical, optical, or any other suitable communication protocols (e.g., the Ethernet). As noted above, the communication chip 2312 may include multiple communication chips. For instance, a first communication chip 2312 may be dedicated to shorter-range wireless communications such as Wi-Fi or Bluetooth, and a second communication chip 2312 may be dedicated to longer-range wireless communications such as global positioning system (GPS), EDGE, GPRS, CDMA, WiMAX, LTE, EV-DO, or others. In some examples, a first communication chip 2312 may be dedicated to wireless communications, and a second communication chip 2312 may be dedicated to wired communications.

The electrical device 2300 may include battery/power circuitry 2314. The battery/power circuitry 2314 may include one or more energy storage devices (e.g., batteries or capacitors) and/or circuitry for coupling components of the electrical device 2300 to an energy source separate from the electrical device 2300 (e.g., AC line power).

The electrical device 2300 may include a display device 2306 (or corresponding interface circuitry, as discussed above). The display device 2306 may include any visual indicators, such as a heads-up display, a computer monitor, a projector, a touchscreen display, a liquid crystal display (LCD), a light-emitting diode display, or a flat panel display.

The electrical device 2300 may include an audio output device 2308 (or corresponding interface circuitry, as discussed above). The audio output device 2308 may include any device that generates an audible indicator, such as speakers, headsets, or earbuds.

The electrical device 2300 may include an audio input device 2324 (or corresponding interface circuitry, as discussed above). The audio input device 2324 may include any device that generates a signal representative of a sound, such as microphones, microphone arrays, or digital instruments (e.g., instruments having a musical instrument digital interface (MIDI) output).

The electrical device 2300 may include a GPS device 2318 (or corresponding interface circuitry, as discussed above). The GPS device 2318 may be in communication with a satellite-based system and may receive a location of the electrical device 2300, as known in the art.

The electrical device 2300 may include any other output device 2310 (or corresponding interface circuitry, as discussed above). Examples of the other output device 2310 may include an audio codec, a video codec, a printer, a wired or wireless transmitter for providing information to other devices, or an additional storage device.

The electrical device 2300 may include any other input device 2320 (or corresponding interface circuitry, as discussed above). Examples of the other input device 2320 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 2300 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 2300 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

From the foregoing, it will be appreciated that example methods, apparatus and articles of manufacture have been disclosed for improving package substrate reliability and/or reducing package substrate manufacturing costs. Specifically, example methods, apparatus and articles of manufacture disclosed herein enable non-roughened metal (e.g., copper) surfaces for high speed input/output (I/O) without compromising adhesion and/or reliability of metal-dielectric-seed interfaces by applying a sputtered adhesion (e.g., SiNx) thin film layer between a metal (e.g., copper) layer and a dielectric layer, followed with plasma-based dry etching, fluorine removal, and wet eless seed deposition. Compared to SiNx films that are provided using PECVD, which requires high process temperature and precursor gases, sputtered SiNx films applied using PVD can be processed at low temperatures, thereby enabling device integrity that are free of impurities/voids and/or provide dense/hermetic characteristics with higher manufacturing throughputs. In addition, example methods and apparatus disclosed herein enable non-roughened copper surfaces for high speed I/O without compromising the adhesion and reliability of the copper-dielectric-seed interfaces by applying a hot water and/or acidic rinse for fluorine (F) removal for effective electro or electroless seed layer adhesion and, thus, substrate and/or die integrity.

Example methods, apparatus, systems, and articles of manufacture to implement glass substrates for semiconductor packages are disclosed herein. Further examples and combinations thereof include the following:

Example 1 includes a package assembly including a substrate, a dielectric layer, a first copper layer between the substrate and the dielectric layer, and a film between the dielectric layer and the first copper layer. The film includes silicon and nitrogen and being substantially free of hydrogen. A via in the dielectric layer provides access to the first copper layer, a portion of the first copper layer uncovered in the via, a wall of the via and the portion of the first copper layer to be substantially free of fluorine. A seed copper layer positioned on the dielectric layer, the via wall and the portion of the first copper layer, the seed copper layer and the first copper layer define an undercut at an interface between the seed copper layer and the first copper layer.

Example 2 includes the package assembly of example 1, where a portion of the film in communication with the via is etched from the first copper layer to uncover the portion of the first copper layer in the via.

Example 3 includes the package assembly of examples 1 or 2, where the substrate is an organic resin.

Example 4 includes the package assembly of any one of examples 1-3, where the first copper layer has a surface finish of approximately between 0.1 micrometers and 5 micrometers.

Example 5 includes a method for providing a package assembly including providing a conductive layer on a substrate; depositing, via physical vapor deposition, an adhesion promotor layer to the conductive layer and exposed surfaces of the substrate; applying a dielectric layer on the adhesion promotor layer; providing a via between a first side of the dielectric layer and a second side of the dielectric layer opposite the first side to expose a portion of the adhesion promotor layer in the via; removing, using dry desmear, the exposed portion of the adhesion promotor layer from the via; rinsing the via with a liquid to remove fluorine (F) residue from the via; and further including applying a reduction conditioner treatment to remove precipitates from the substrate after the rinsing the substrate with the liquid.

Example 6 includes the method of example 5, further including providing the via using laser drilling.

Example 7 includes the method of examples 5 or 6, where the providing of the conductive layer includes providing the conductive layer with a smooth, non-roughened surface finish.

Example 8 includes the method of any one of examples 5-7, further including removing, via the dry desmear, dielectric residual material from the via.

Example 9 includes the method of any one of examples 5-8, where rinsing the via with the liquid includes rinsing the via with water having a temperature that exceeds approximately 70 degrees Celsius.

Example 10 includes the method of any one of examples 5-9, where rinsing the via with the liquid further includes rinsing the via assembly with an acid.

Example 11 includes the method of any one of examples 5-10, where applying the reduction conditioner treatment includes applying a sulfuric acid.

Example 12 includes a method for manufacturing a package substrate including depositing a conductive layer on a first side of a substrate, the conductive layer having a smooth, non-roughened surface finish; depositing a non-roughening adhesion promotor layer on the substrate and the conductive layer; laminating a dielectric material to the non-roughening adhesion promotor layer; drilling a via in the dielectric material to expose a portion of the non-roughening adhesion promotor layer; removing, via dry desmear, the exposed portion of the non-roughening adhesion promotor layer to uncover a portion of the conductive layer in the via; rinsing the uncovered portion of the conductive layer in the via with a liquid; and applying a seed layer to the uncovered portion of the conductive layer and a wall of the via.

Example 13 includes the method of example 12, where the substrate includes an organic material and the non-roughening adhesion promotor layer includes an inorganic material.

Example 14 includes the method of any one of examples 12-13, further including employing physical vapor deposition to deposit the non-roughening adhesion promotor layer.

Example 15 includes the method of any one of examples 12-14, further including drilling the via using at least one of ultraviolet (UV) drilling or carbon dioxide ($CO_2$) drilling.

Example 16 includes the method of any one of examples 12-15, further including removing, via dry desmear, dielectric residual material from the uncovered portion of the conductive layer within the via.

Example 17 includes the method of any one of examples 12-16, where rinsing with a liquid includes rinsing the uncovered portion with water having a temperature greater than approximately 70° C.

Example 18 includes the method of any one of examples 12-17, further including applying a reduction conditioner treatment to remove precipitates from the via after rinsing the via with the liquid.

Example 19 includes the method of any one of examples 12-18, where the applying the reduction conditioner treatment includes exposing the substrate to sulfuric acid.

Example 20 includes the method of any one of examples 12-19, where the applying of the seed layer includes using an electro or electro-less plating manufacturing techniques.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A substrate assembly comprising:
   a substrate;
   a dielectric layer;
   a first copper layer between the substrate and the dielectric layer;
   a film between the dielectric layer and the first copper layer, the film including silicon and nitrogen and being substantially free of hydrogen;
   a via in the dielectric layer to provide access to the first copper layer, a portion of the first copper layer uncovered in the via, a wall of the via and the portion of the first copper layer to be substantially free of fluorine; and
   a seed copper layer positioned on the dielectric layer, the via wall and the portion of the first copper layer, the seed copper layer and the first copper layer define an undercut at an interface between the seed copper layer and the first copper layer.

2. The substrate assembly of claim 1, wherein a portion of the film in communication with the via is etched from the first copper layer to uncover the portion of the first copper layer in the via.

3. The substrate assembly of claim 1, wherein the substrate is an organic resin.

4. The substrate assembly of claim 1, wherein the first copper layer has a surface finish of approximately between 0.1 micrometers and 5 micrometers.

5. A method for manufacturing a package assembly, the method comprising:
   providing a conductive layer on a substrate;
   depositing, via physical vapor deposition, an adhesion promotor layer to the conductive layer and exposed surfaces of the substrate;
   applying a dielectric layer on the adhesion promotor layer;
   providing a via between a first side of the dielectric layer and a second side of the dielectric layer opposite the first side to expose a portion of the adhesion promotor layer in the via;
   removing, using dry desmear, the exposed portion of the adhesion promotor layer from the via;
   rinsing the via with a liquid to remove fluorine (F) residue from the via; and
   applying a reduction conditioner treatment to remove precipitates from the substrate after the rinsing of the via with the liquid.

6. The method of claim 5, further including providing the via using laser drilling.

7. The method of claim 6, wherein the providing of the conductive layer includes providing the conductive layer with a smooth, non-roughened surface finish.

8. The method of claim 5, further including removing, via the dry desmear, dielectric residual material from the via.

9. The method of claim 5, wherein rinsing the via with the liquid includes rinsing the via with water having a temperature that exceeds approximately 70 degrees Celsius.

10. The method of claim 9, wherein rinsing the via with the liquid further includes rinsing the via with an acid.

11. The method of claim 5, wherein applying the reduction conditioner treatment includes applying a sulfuric acid.

12. A method for manufacturing a package substrate, the method comprising:

depositing a conductive layer on a first side of a substrate, the conductive layer having a smooth, non-roughened surface finish;

depositing a non-roughening adhesion promotor layer on the substrate and the conductive layer;

laminating a dielectric material to the non-roughening adhesion promotor layer;

drilling a via in the dielectric material to expose a portion of the non-roughening adhesion promotor layer;

removing, via dry desmear, the exposed portion of the non-roughening adhesion promotor layer to uncover a portion of the conductive layer in the via;

rinsing the uncovered portion of the conductive layer in the via with a liquid; and applying a seed layer to the uncovered portion of the conductive layer and a wall of the via.

13. The method of claim 12, wherein the substrate includes an organic material and the non-roughening adhesion promotor layer includes an inorganic material.

14. The method of claim 12, further including employing physical vapor deposition to deposit the non-roughening adhesion promotor layer.

15. The method of claim 12, further including drilling the via using at least one of ultraviolet (UV) drilling or carbon dioxide ($CO_2$) drilling.

16. The method of claim 12, further including removing, via dry desmear, dielectric residual material from the uncovered portion of the conductive layer within the via.

17. The method of claim 12, further including rinsing the uncovered portion with water having a temperature greater than approximately 70 degrees Celsius.

18. The method of claim 12, further including applying a reduction conditioner treatment to remove precipitates from the substrate after rinsing the substrate with the liquid.

19. The method of claim 18, wherein the applying the reduction conditioner treatment includes exposing the substrate to sulfuric acid.

20. The method of claim 12, wherein the applying of the seed layer includes using an electro or electro-less plating manufacturing technique.

* * * * *